United States Patent
Lee

(10) Patent No.: US 10,796,747 B2
(45) Date of Patent: Oct. 6, 2020

(54) SEMICONDUCTOR DEVICE

(71) Applicant: SK hynix Inc., Icheon-si Gyeonggi-do (KR)

(72) Inventor: Jung Hwan Lee, Guri-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 38 days.

(21) Appl. No.: 16/200,307

(22) Filed: Nov. 26, 2018

(65) Prior Publication Data

US 2020/0027496 A1    Jan. 23, 2020

(30) Foreign Application Priority Data

Jul. 18, 2018  (KR) ........................ 10-2018-0083292

(51) Int. Cl.
  *G11C 11/24* (2006.01)
  *G11C 11/408* (2006.01)
  *G11C 11/406* (2006.01)

(52) U.S. Cl.
  CPC .... *G11C 11/4085* (2013.01); *G11C 11/40607* (2013.01)

(58) Field of Classification Search
  CPC ...................... G11C 11/4085; G11C 11/40607
  See application file for complete search history.

(56) References Cited

U.S. PATENT DOCUMENTS

| 9,274,715 B2 | 3/2016 | Chun et al. | |
| 2010/0110810 A1* | 5/2010 | Kobayashi | G11C 11/406 |
| | | | 365/200 |
| 2017/0287547 A1* | 10/2017 | Ito | G11C 29/783 |

FOREIGN PATENT DOCUMENTS

KR    1020170103435 A    9/2017

* cited by examiner

*Primary Examiner* — Uyen Smet
(74) *Attorney, Agent, or Firm* — William Park & Associates Ltd.

(57) ABSTRACT

A semiconductor device includes a soft repair control circuit configured to generate an enable signal, in response to a soft repair control signal, wherein the enable signal is enabled when first and second internal addresses counted in a refresh operation have the same combination as first and second failure addresses, and the semiconductor device also includes a core circuit including first, second, third, and fourth regions each including a plurality of word lines which are activated based on a combination of the first, the second, third, and fourth internal addresses, wherein the core circuit is configured to repair, in response to the enable signal, a word line in which a failure has occurred and which is included in a region selected among the first, second, third, and fourth regions by the third and fourth internal addresses.

28 Claims, 14 Drawing Sheets

FIG. 4

| IADD<14> | IADD<13> | SELECTED REGION |
|---|---|---|
| L | L | FIRST REGION |
| L | H | SECOND REGION |
| H | L | THIRD REGION |
| H | H | FOURTH REGION |

SEMICONDUCTOR DEVICE

CROSS-REFERENCE TO RELATED APPLICATION

The present application claims priority under 35 U.S.C. § 119(a) to Korean Patent Application No. 10-2018-0083292 filed on Jul. 18, 2018, in the Korean Intellectual Property Office, which is incorporated herein by reference in its entirety.

BACKGROUND

1. Technical Field

Embodiments of the present disclosure relate to a semiconductor device which performs a repair operation during a refresh operation.

2. Related Art

Among semiconductor devices, a DRAM (dynamic random access memory) has such a characteristic that information stored in memory cells thereof disappears as a time goes by, unlike for an SRAM (static random access memory) or a flash memory. In order to prevent such a phenomenon, an operation of rewriting information stored in memory cells is performed from outside with a predetermined period. Such an operation is referred to as a refresh. The refresh is performed in such a way as to activate each word line at least one time within a retention time of memory cells, or the like, and sense and amplify data. The retention time refers to a time during which data can be retained in a memory cell without a refresh after the data is written in the memory cell.

A semiconductor device is tested in terms of whether or not there is a problem in the operation of the semiconductor device, before it is released as a product. A semiconductor device capable of normal operation is released as a product. Such a test supports repair of a semiconductor device in which a small number of data failures have occurred. Repair is performed through a series of operations of replacing a word line coupled to a memory cell in which a failure has occurred, with a redundancy word line.

SUMMARY

In accordance with the teachings herein, a semiconductor device may include a soft repair control circuit configured to generate an enable signal, in response to a soft repair control signal, wherein the enable signal is enabled when first and second internal addresses counted in a refresh operation have the same combination as first and second failure addresses, and the semiconductor device also includes a core circuit including first, second, third, and fourth regions each including a plurality of word lines which are activated based on a combination of the first, the second, third, and fourth internal addresses, wherein the core circuit is configured to repair, in response to the enable signal, a word line in which a failure has occurred and which is included in a region selected among the first, second, third, and fourth regions by the third and fourth internal addresses.

Also in accordance with the teachings herein, a semiconductor device may include first, second, third, and fourth regions which each include a plurality of word lines and a plurality of redundancy word lines, wherein at least one of the first, second, third, and fourth regions are selectively activated depending on first, second, third, and fourth internal addresses in a refresh operation in response to an enable signal, and wherein a word line in which a failure has occurred and which is included in a region activated among the first, second, third, and fourth regions depending on the first, second, third, and fourth internal addresses is repaired.

Further in accordance with the teachings herein, a semiconductor device may store internal addresses including information on a region selected among a plurality of regions included in a core circuit, in a soft repair operation during a refresh operation, and may perform a repair operation, for an embodiment, in only a region selectively activated by the stored internal addresses, thereby preventing a repetitive repair operation by a failure address.

BRIEF DESCRIPTION OF THE DRAWINGS

FIG. 4 shows a table to assist in the explanation of a region selected depending on the combination of internal addresses in accordance with an embodiment.

DETAILED DESCRIPTION

Various embodiments of a semiconductor device are described below with reference to the accompanying drawings. Embodiments, for example, are directed to a semiconductor device which stores internal addresses including an information on a region selected among a plurality of regions included in a core circuit, in a soft repair operation during a refresh operation, and performs a repair operation in only a region selectively activated by the stored internal addresses, thereby preventing a repetitive repair operation by a failure address.

Further, the logic levels of the signals may be different from or the opposite of those described. For example, a signal described as having a logic "high" level may alternatively have a logic "low" level, and a signal described as having a logic "low" level may alternatively have a logic "high" level.

Figure 1:
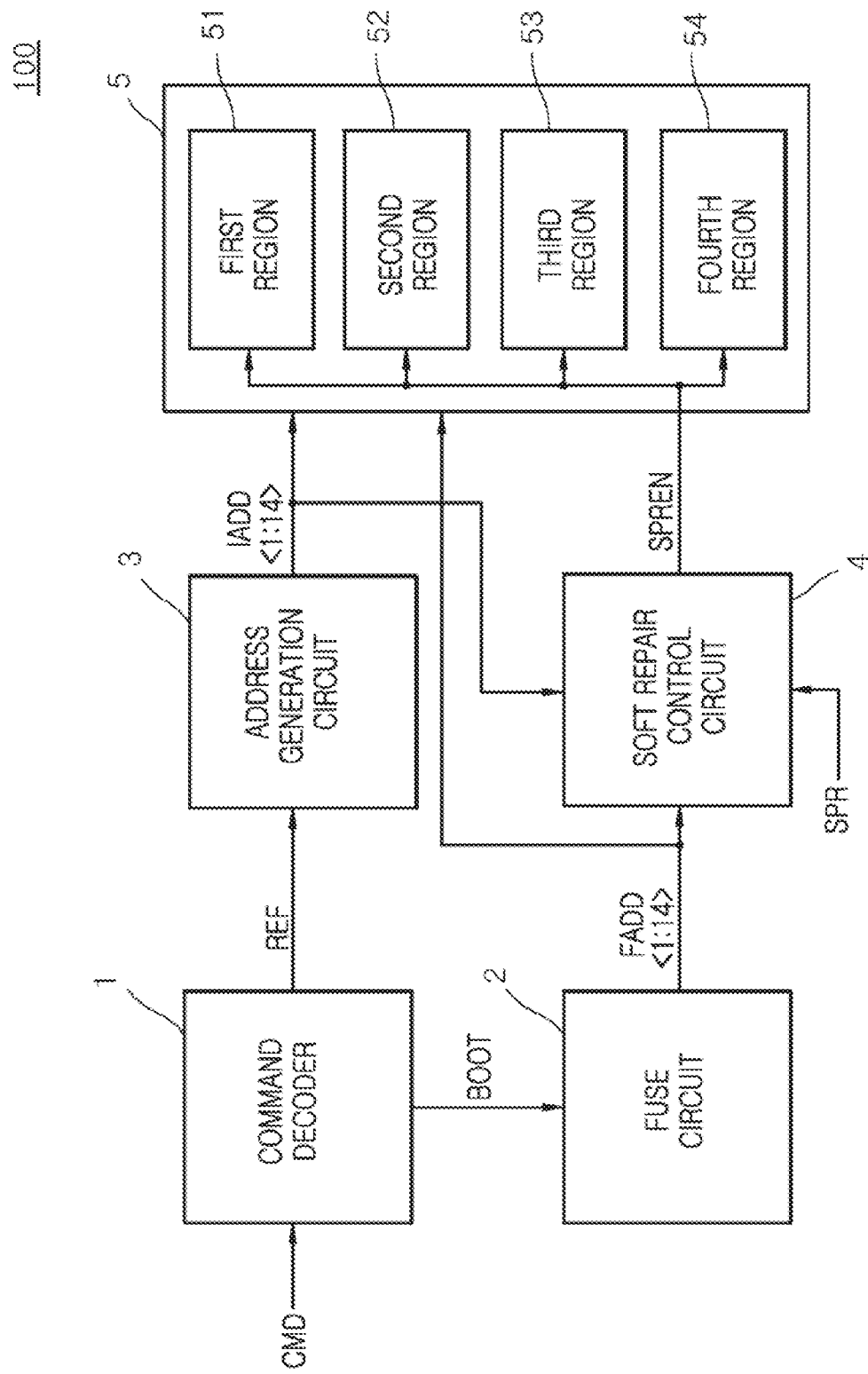
FIG. 1 shows a block diagram illustrating a configuration of a semiconductor device in accordance with an embodiment.

As shown in FIG. 1, a semiconductor device 100 in accordance with an embodiment may include a command decoder 1, a fuse circuit 2, an address generation circuit 3, a soft repair control circuit 4, and a core circuit 5.

The command decoder 1 may generate a refresh signal REF in response to a command CMD. The command decoder 1 may generate the refresh signal REF by decoding the command CMD. The command decoder 1 may generate a boot-up signal BOOT in response to the command CMD. The command decoder 1 may generate the boot-up signal BOOT by decoding the command CMD. The refresh signal REF may be set as a signal which is enabled to perform the refresh operation of the semiconductor device 100. The boot-up signal BOOT may be set as a signal which is enabled to perform the boot-up operation of the semiconductor device 100. The boot-up operation may be set as an operation for outputting the information programmed in the fuse circuit 2. While the command CMD is illustrated as one signal, the command CMD may be set as a command or signal including a plurality of signals for controlling the operation of the semiconductor device 100.

The fuse circuit 2 may include a plurality of fuses. The plurality of fuses may be implemented by anti-fuses. The fuse circuit 2 may output first to fourteenth failure addresses FADD<1:14> in response to the boot-up signal BOOT. The first to fourteenth failure addresses FADD<1:14> may include position information for a word line in which a failure has occurred, among the word lines included in first to fourth regions 51 to 54 of the core circuit 5. The first to fourteenth failure addresses FADD<1:14> may be programmed as a test is performed before the semiconductor device 100 operates.

The address generation circuit 3 may generate first to fourteenth internal addresses IADD<1:14> in response to the refresh signal REF. The address generation circuit 3 may generate the first to fourteenth internal addresses IADD<1:14> which are sequentially counted, in the case where the refresh signal REF is enabled.

The soft repair control circuit 4 may generate an enable signal SPREN by comparing the first to twelfth internal addresses IADD<1:12> and the first to twelfth failure addresses FADD<1:12> in response to a soft repair control signal SPR. The soft repair control circuit 4 may generate the enable signal SPREN which is enabled, in the case where the first to twelfth internal addresses IADD<1:12> and the first to twelfth failure addresses FADD<1:12> have the same logic level combination in response to the soft repair control signal SPR. The soft repair control signal SPR may be set as a signal which is enabled to enter a soft repair operation of repairing a word line in which a failure has occurred, during a refresh operation.

The core circuit 5 may include the first region 51, the second region 52, the third region 53, and the fourth region 54.

The first region 51 may activate a word line which is selected depending on the first to fourteenth internal addresses IADD<1:14>. The first region 51 may activate a word line which is selected depending on the first to fourteenth internal addresses IADD<1:14> sequentially counted in the refresh operation. The first region 51 may perform a repair operation depending on the first to fourteenth failure addresses FADD<1:14> in response to the enable signal SPREN. The first region 51 may perform the repair operation depending on the first to fourteenth failure addresses FADD<1:14> in the case where the enable signal SPREN is disabled. The first region 51 may perform the repair operation in the case where the enable signal SPREN is enabled and the thirteenth and fourteenth internal addresses IADD<13:14> have a first combination. The first region 51 may perform the repair operation depending on the first to fourteenth internal addresses IADD<1:14> in response to the enable signal SPREN. The first region 51 may perform the repair operation depending on the first to fourteenth internal addresses IADD<1:14> in the case where the enable SPREN is enabled. The repair operation may be set as an operation of replacing a word line in which a failure has occurred with a redundancy word line.

The second region 52 may activate a word line which is selected depending on the first to fourteenth internal addresses IADD<1:14>. The second region 52 may activate a word line which is selected depending on the first to fourteenth internal addresses IADD<1:14> sequentially counted in the refresh operation. The second region 52 may perform the repair operation depending on the first to fourteenth failure addresses FADD<1:14> in response to the enable signal SPREN. The second region 52 may perform the repair operation depending on the first to fourteenth failure addresses FADD<1:14> in the case where the enable signal SPREN is disabled. The second region 52 may perform the repair operation in the case where the enable signal SPREN is enabled and the thirteenth and fourteenth internal addresses IADD<13:14> have a second combination. The second region 52 may perform the repair operation depending on the first to fourteenth internal addresses IADD<1:14> in response to the enable signal SPREN. The second region 52 may perform the repair operation depending on the first to fourteenth internal addresses IADD<1:14> in the case where the enable SPREN is enabled.

The third region 53 may activate a word line which is selected depending on the first to fourteenth internal addresses IADD<1:14>. The third region 53 may activate a word line which is selected depending on the first to fourteenth internal addresses IADD<1:14> sequentially counted in the refresh operation. The third region 53 may perform the repair operation depending on the first to fourteenth failure addresses FADD<1:14> in response to the enable signal SPREN. The third region 53 may perform the repair operation depending on the first to fourteenth failure addresses FADD<1:14> in the case where the enable signal SPREN is disabled. The third region 53 may perform the repair operation in the case where the enable signal SPREN is enabled and the thirteenth and fourteenth internal addresses IADD<13:14> have a third combination. The third region 53 may perform the repair operation depending on the first to fourteenth internal addresses IADD<1:14> in response to the enable signal SPREN. The third region 53 may perform the repair operation depending on the first to fourteenth internal addresses IADD<1:14> in the case where the enable SPREN is enabled.

The fourth region 54 may activate a word line which is selected depending on the first to fourteenth internal addresses IADD<1:14>. The fourth region 54 may activate a word line which is selected depending on the first to fourteenth internal addresses IADD<1:14> sequentially counted in the refresh operation. The fourth region 54 may perform the repair operation depending on the first to fourteenth failure addresses FADD<1:14> in response to the enable signal SPREN. The fourth region 54 may perform the repair operation depending on the first to fourteenth failure addresses FADD<1:14> in the case where the enable signal SPREN is disabled. The fourth region 54 may perform the repair operation in the case where the enable signal SPREN is enabled and the thirteenth and fourteenth internal addresses IADD<13:14> have a fourth combination. The fourth region 54 may perform the repair operation depending on the first to fourteenth internal addresses IADD<1:14> in response to the enable signal SPREN. The fourth region 54 may perform the repair operation depending on the first to fourteenth internal addresses IADD<1:14> in the case where the enable SPREN is enabled.

Such a core circuit 5 may include the first to fourth regions 51 to 54 including a word line which is activated depending on the first to fourteenth internal addresses IADD<1:14>. The core circuit 5 may repair a word line in which a failure has occurred, included in a region selected from among the first to fourth regions 51 to 54 depending on the first to fourteenth internal addresses IADD<1:14> in response to the enable signal SPREN.

In an embodiment, the first to fourth regions 51 to 54 may be implemented as one bank. Also, the core circuit 5 for an embodiment may be implemented to include a plurality of banks.

Figure 2:
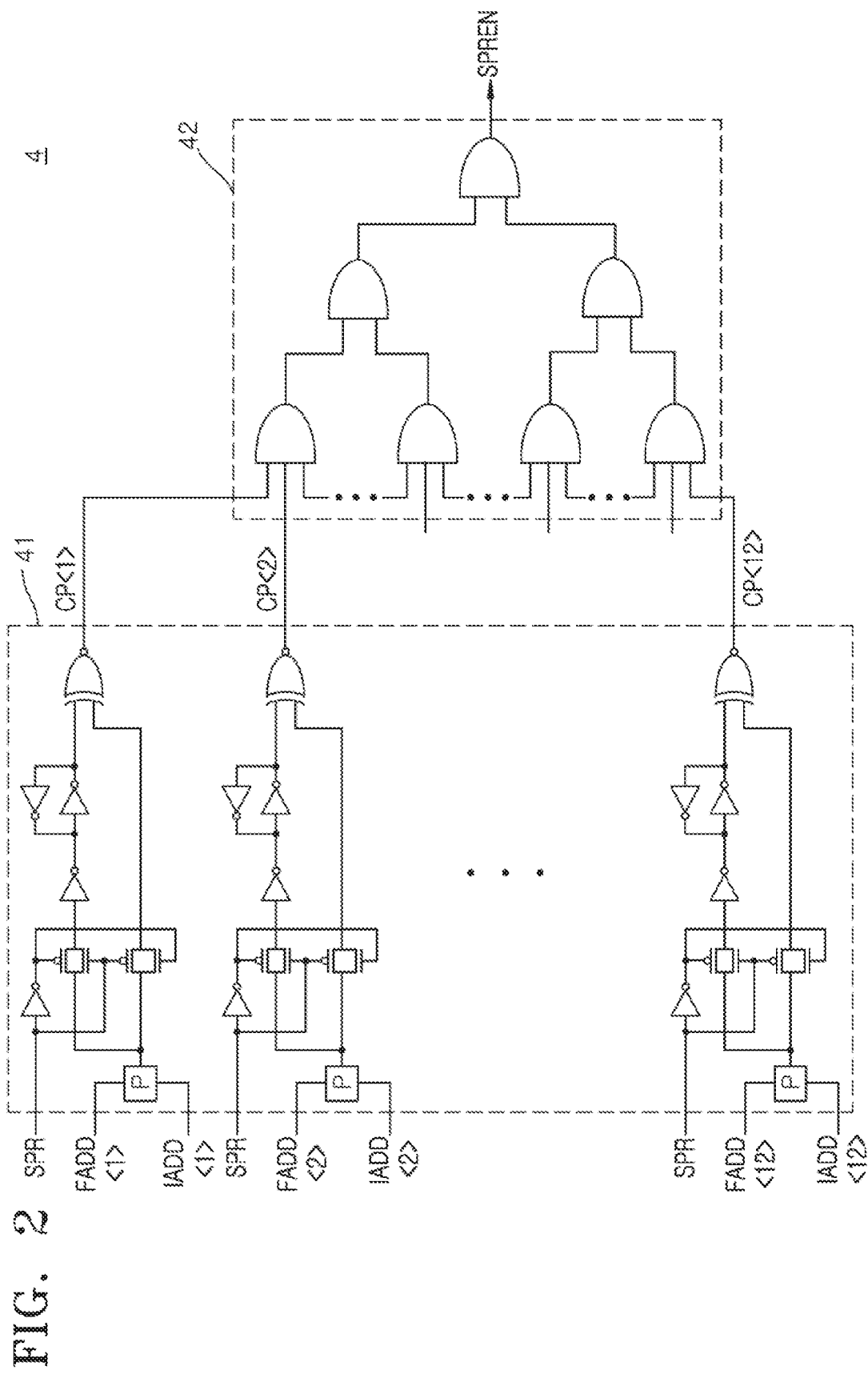
FIG. 2 shows a circuit diagram illustrating a configuration of the soft repair control circuit included in the semiconductor device shown in FIG. 1.

Referring to FIG. 2, the soft repair control circuit 4 may include a comparison signal generation circuit 41 and an enable signal generation circuit 42.

The comparison signal generation circuit 41 may store the first to twelfth failure addresses FADD<1:12> in response to the soft repair control signal SPR, and may generate first to twelfth comparison signals CP<1:12> by comparing the combinations of the stored first to twelfth failure addresses FADD<1:12> and the first to twelfth internal addresses IADD<1:12>. The comparison signal generation circuit 41 may store the first to twelfth failure addresses FADD<1:12> in the case where the soft repair control signal SPR is at a logic high level. The comparison signal generation circuit 41 may generate the first to twelfth comparison signals CP<1:12> by comparing the combinations of the stored first to twelfth failure addresses FADD<1:12> and the first to twelfth internal addresses IADD<1:12>, in the case where the soft repair control signal SPR is at a logic low level. For example, in the case where the first failure address FADD<1> and the first internal address IADD<1> are at the same logic level, the first comparison signal CP<1> is generated at a logic high level.

The enable signal generation circuit 42 may generate the enable signal SPREN in response to the first to twelfth comparison signals CP<1:12>. The enable signal generation circuit 42 may generate the enable signal SPREN which is enabled to a logic high level, in the case where all the first to twelfth comparison signals CP<1:12> are at logic high levels. The enable signal generation circuit 42 may generate the enable signal SPREN which is disabled to a logic low level, in the case where any one among the first to twelfth comparison signals CP<1:12> is at a logic low level.

The configurations of the first region 51, the second region 52, the third region 53, and the fourth region 54 included in the core circuit 5 are described below with reference to FIG. 3.

Figure 3:
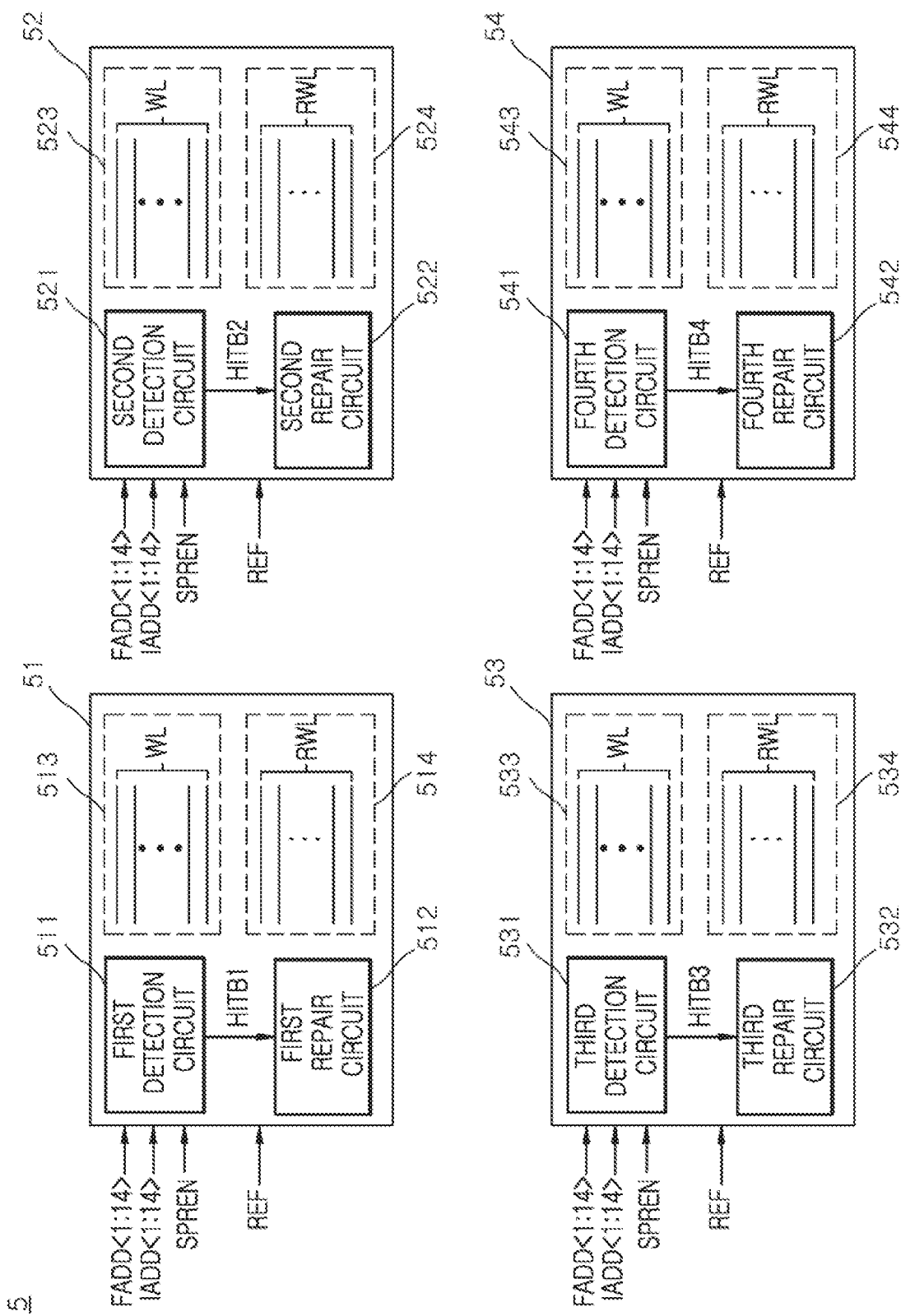
FIG. 3 shows a block diagram illustrating a configuration of the core circuit included in the semiconductor device shown in FIG. 1.

Referring to FIG. 3, the first region 51 may include a first detection circuit 511, a first repair circuit 512, a first word line group 513, and a first redundancy word line group 514.

The first detection circuit 511 may generate a first repair signal HITB1 by comparing the first to twelfth failure addresses FADD<1:12> and the first to twelfth internal addresses IADD<1:12> during the refresh operation. The first detection circuit 511 may be activated in the case where the thirteenth and fourteenth internal addresses IADD<13:14> have a first combination in response to the refresh signal REF and the enable signal SPREN. The first detection circuit 511 may generate the first repair signal HITB1 by comparing the first to twelfth failure addresses FADD<1:12> and the first to twelfth internal addresses IADD<1:12> in the case where the thirteenth and fourteenth internal addresses IADD<13:14> have the first combination in response to the refresh signal REF and the enable signal SPREN. The case where the thirteenth and fourteenth internal addresses IADD<13:14> have the first combination is described later with reference to FIG. 4.

The first repair circuit 512 may replace a word line, which is activated by the first to twelfth internal addresses IADD<1:12>, with a redundancy word line, in response to the first repair signal HITB1. The first repair circuit 512 may replace a word line, which is activated by the first to twelfth internal addresses IADD<1:12>, with a redundancy word line, in the case where the first repair signal HITB1 is enabled to a logic low level. The first repair circuit 512 may replace a word line in which a failure has occurred by the first to fourteenth failure addresses FADD<1:14>, with a redundancy word line, in response to the first repair signal HITB1. The first repair circuit 512 may replace a word line in which a failure has occurred by the first to fourteenth failure addresses FADD<1:14>, with a redundancy word line, in the case where the first repair signal HITB1 is disabled to a logic high level.

The first word line group 513 may include a plurality of word lines WL. In the first word line group 513, one among the plurality of word lines WL may be activated by the first to fourteenth internal addresses IADD<1:14>.

The first redundancy word line group 514 may include a plurality of redundancy word lines RWL. In the first redundancy word line group 514, the repair operation of replacing a word line WL in which a failure has occurred, with a redundancy word line RWL, may be performed by the first repair circuit 512.

The second region 52 may include a second detection circuit 521, a second repair circuit 522, a second word line group 523, and a second redundancy word line group 524.

The second detection circuit 521 may generate a second repair signal HITB2 by comparing the first to twelfth failure addresses FADD<1:12> and the first to twelfth internal addresses IADD<1:12> during the refresh operation. The second detection circuit 521 may be activated in the case where the thirteenth and fourteenth internal addresses IADD<13:14> have a second combination in response to the refresh signal REF and the enable signal SPREN. The second detection circuit 521 may generate the second repair signal HITB2 by comparing the first to twelfth failure addresses FADD<1:12> and the first to twelfth internal addresses IADD<1:12> in the case where the thirteenth and fourteenth internal addresses IADD<13:14> have the second combination in response to the refresh signal REF and the enable signal SPREN. The case where the thirteenth and fourteenth internal addresses IADD<13:14> have the second combination is described later with reference to FIG. 4.

The second repair circuit 522 may replace a word line which is activated by the first to twelfth internal addresses IADD<1:12>, with a redundancy word line, in response to the second repair signal HITB2. The second repair circuit 522 may replace a word line which is activated by the first to twelfth internal addresses IADD<1:12>, with a redundancy word line, in the case where the second repair signal HITB2 is enabled to a logic low level. The second repair circuit 522 may replace a word line in which a failure has occurred by the first to fourteenth failure addresses FADD<1:14>, with a redundancy word line, in response to the second repair signal HITB2. The second repair circuit 522 may replace a word line in which a failure has occurred by the first to fourteenth failure addresses FADD<1:14>, with a redundancy word line, in the case where the second repair signal HITB2 is disabled to a logic high level.

The second word line group 523 may include a plurality of word lines WL. In the second word line group 523, one among the plurality of word lines WL may be activated by the first to fourteenth internal addresses IADD<1:14>.

The second redundancy word line group 524 may include a plurality of redundancy word lines RWL. In the second redundancy word line group 524, the repair operation of replacing a word line WL in which a failure has occurred, with a redundancy word line RWL, may be performed by the second repair circuit 522.

The third region 53 may include a third detection circuit 531, a third repair circuit 532, a third word line group 533 and a third redundancy word line group 534.

The third detection circuit 531 may generate a third repair signal HITB3 by comparing the first to twelfth failure addresses FADD<1:12> and the first to twelfth internal addresses IADD<1:12> during the refresh operation. The third detection circuit 531 may be activated in the case where the thirteenth and fourteenth internal addresses IADD<13:14> have a third combination in response to the refresh signal REF and the enable signal SPREN. The third detection circuit 531 may generate the third repair signal HITB3 by comparing the first to twelfth failure addresses FADD<1:12> and the first to twelfth internal addresses IADD<1:12> in the case where the thirteenth and fourteenth internal addresses IADD<13:14> have the third combination in response to the refresh signal REF and the enable signal SPREN. The case where the thirteenth and fourteenth internal addresses IADD<13:14> have the third combination is described later with reference to FIG. 4.

The third repair circuit 532 may replace a word line which is activated by the first to twelfth internal addresses IADD<1:12>, with a redundancy word line, in response to the third repair signal HITB3. The third repair circuit 532 may replace a word line which is activated by the first to twelfth internal addresses IADD<1:12>, with a redundancy word line, in the case where the third repair signal HITB3 is enabled to a logic low level. The third repair circuit 532 may replace a word line in which a failure has occurred by the first to fourteenth failure addresses FADD<1:14>, with a redundancy word line, in response to the third repair signal HITB3. The third repair circuit 532 may replace a word line in which a failure has occurred by the first to fourteenth failure addresses FADD<1:14>, with a redundancy word line, in the case where the third repair signal HITB3 is disabled to a logic high level.

The third word line group 533 may include a plurality of word lines WL. In the third word line group 533, one among the plurality of word lines WL may be activated by the first to fourteenth internal addresses IADD<1:14>.

The third redundancy word line group 534 may include a plurality of redundancy word lines RWL. In the third redundancy word line group 534, the repair operation of replacing a word line WL in which a failure has occurred, with a redundancy word line RWL, may be performed by the third repair circuit 532.

The fourth region 54 may include a fourth detection circuit 541, a fourth repair circuit 542, a fourth word line group 543 and a fourth redundancy word line group 544.

The fourth detection circuit 541 may generate a fourth repair signal HITB4 by comparing the first to twelfth failure addresses FADD<1:12> and the first to twelfth internal addresses IADD<1:12> during the refresh operation. The fourth detection circuit 541 may be activated in the case where the thirteenth and fourteenth internal addresses IADD<13:14> have a fourth combination in response to the refresh signal REF and the enable signal SPREN. The fourth detection circuit 541 may generate the fourth repair signal HITB4 by comparing the first to twelfth failure addresses FADD<1:12> and the first to twelfth internal addresses IADD<1:12> in the case where the thirteenth and fourteenth internal addresses IADD<13:14> have the fourth combination in response to the refresh signal REF and the enable signal SPREN. The case where the thirteenth and fourteenth internal addresses IADD<13:14> have the fourth combination is described later with reference to FIG. 4.

The fourth repair circuit 542 may replace a word line which is activated by the first to twelfth internal addresses IADD<1:12>, with a redundancy word line, in response to the fourth repair signal HITB4. The fourth repair circuit 542 may replace a word line which is activated by the first to twelfth internal addresses IADD<1:12>, with a redundancy word line, in the case where the fourth repair signal HITB4 is enabled to a logic low level. The fourth repair circuit 542 may replace a word line in which a failure has occurred by the first to fourteenth failure addresses FADD<1:14>, with a redundancy word line, in response to the fourth repair signal HITB4. The fourth repair circuit 542 may replace a word line in which a failure has occurred by the first to fourteenth failure addresses FADD<1:14>, with a redundancy word line, in the case where the fourth repair signal HITB4 is disabled to a logic high level.

The fourth word line group 543 may include a plurality of word lines WL. In the fourth word line group 543, one among the plurality of word lines WL may be activated by the first to fourteenth internal addresses IADD<1:14>.

The fourth redundancy word line group 544 may include a plurality of redundancy word lines RWL. In the fourth redundancy word line group 544, the repair operation of replacing a word line WL in which a failure has occurred, with a redundancy word line RWL, may be performed by the fourth repair circuit 542.

A region selected depending on the combination of the thirteenth and fourteenth internal addresses IADD<13:14> in accordance with an embodiment is described below with reference to FIG. 4.

Referring to FIG. 4, the case where the thirteenth and fourteenth internal addresses IADD<13:14> have the first combination may be set as a case where the thirteenth internal address IADD<13> is at a logic low level (L) and the fourteenth internal address IADD<14> is at a logic low level (L). In the case where the thirteenth and fourteenth internal addresses IADD<13:14> have the first combination, the first region 51 may be selected and activated.

The case where the thirteenth and fourteenth internal addresses IADD<13:14> have the second combination may be set as a case where the thirteenth internal address IADD<13> is at a logic high level (H) and the fourteenth internal address IADD<14> is at the logic low level (L). In the case where the thirteenth and fourteenth internal addresses IADD<13:14> have the second combination, the second region 52 may be selected and activated.

The case where the thirteenth and fourteenth internal addresses IADD<13:14> have the third combination may be set as a case where the thirteenth internal address IADD<13> is at the logic low level (L) and the fourteenth internal address IADD<14> is at a logic high level (H). In the case where the thirteenth and fourteenth internal addresses IADD<13:14> have the third combination, the third region 53 may be selected and activated.

The case where the thirteenth and fourteenth internal addresses IADD<13:14> have the fourth combination may be set as a case where the thirteenth internal address IADD<13> is at the logic high level (H) and the fourteenth internal address IADD<14> is at the logic high level (H). In the case where the thirteenth and fourteenth internal addresses IADD<13:14> have the fourth combination, the fourth region 54 may be selected and activated.

Figure 5:
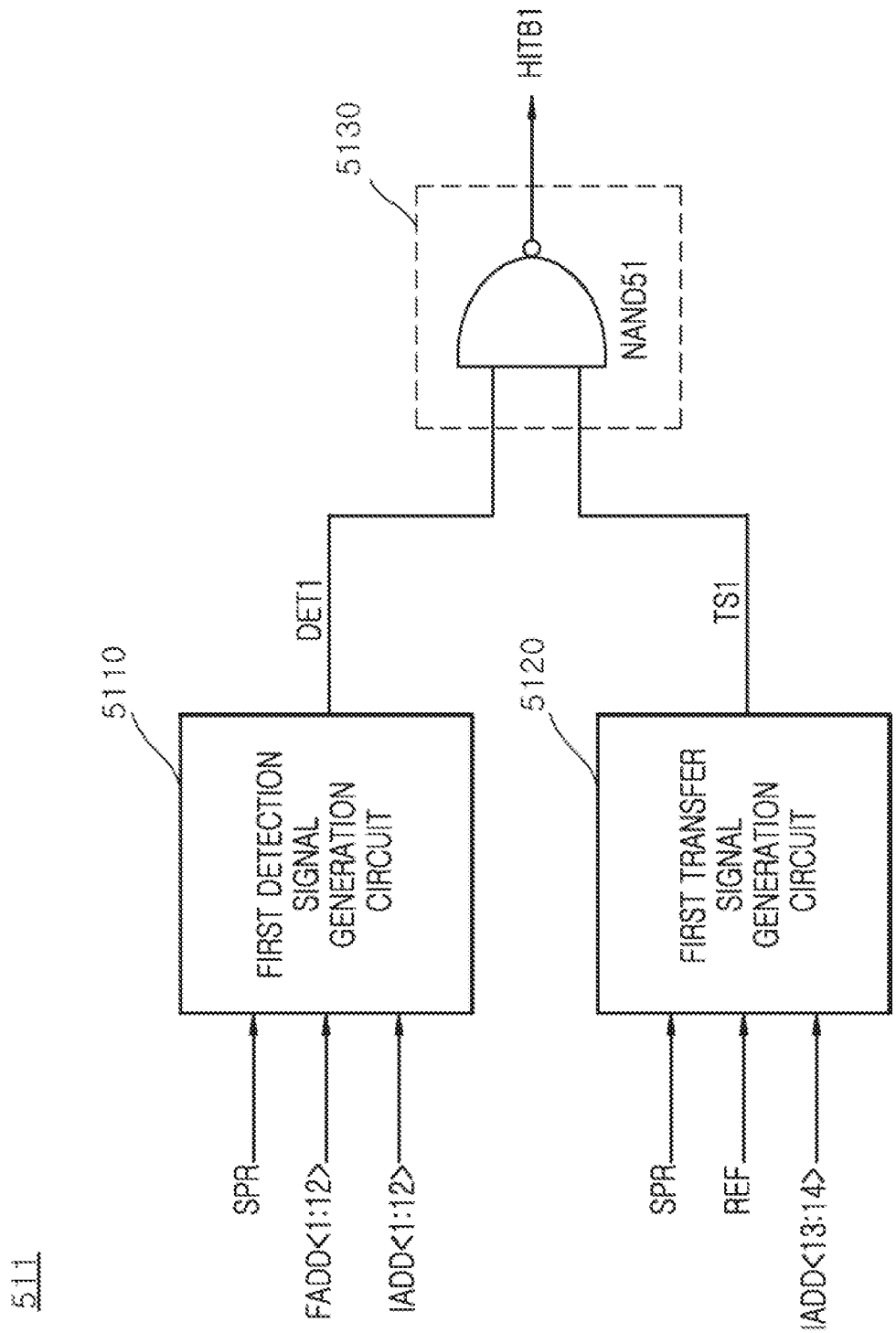
FIG. 5 shows a diagram illustrating a representation of a configuration of the first detection circuit included in the first region shown in FIG. 3.

Referring to FIG. 5, the first detection circuit 511 may include a first detection signal generation circuit 5110, a first transfer signal generation circuit 5120, and a first logic circuit 5130.

The first detection signal generation circuit 5110 may generate a first detection signal DET1 by comparing the first to twelfth failure addresses FADD<1:12> and the first to twelfth internal addresses IADD<1:12> in response to the soft repair control signal SPR. The first detection signal generation circuit 5110 may store the first to twelfth failure addresses FADD<1:12> in response to the soft repair control signal SPR. The first detection signal generation circuit 5110 may generate the first detection signal DET1 by comparing the stored first to twelfth failure addresses FADD<1:12> and the first to twelfth internal addresses IADD<1:12>.

The first transfer signal generation circuit 5120 may store the thirteenth and fourteenth internal addresses IADD<13:14> in response to the soft repair control signal SPR. The first transfer signal generation circuit 5120 may generate a first transfer signal TS1 depending on the logic levels of the thirteenth and fourteenth internal addresses IADD<13:14> stored in response to the refresh signal REF and the soft repair control signal SPR. The first transfer signal generation circuit 5120 may generate the first transfer signal TS1 of a logic high level in the case where the soft repair control signal SPR is at the logic low level and the stored thirteenth and fourteenth internal addresses IADD<13:14> have the first combination.

The first logic circuit 5130 may be implemented by a NAND gate NAND51. The first logic circuit 5130 may generate the first repair signal HITB1 by inverting and buffering the first detection signal DET1 in response to the first transfer signal TS1. The first logic circuit 5130 may generate the first repair signal HITB1 by inverting and buffering the first detection signal DET1, in the case where the first transfer signal TS1 is at the logic high level. The first logic circuit 5130 may generate the first repair signal HITB1 by performing a NAND logic operation on the first transfer signal TS1 and the first detection signal DET1.

Figure 6:
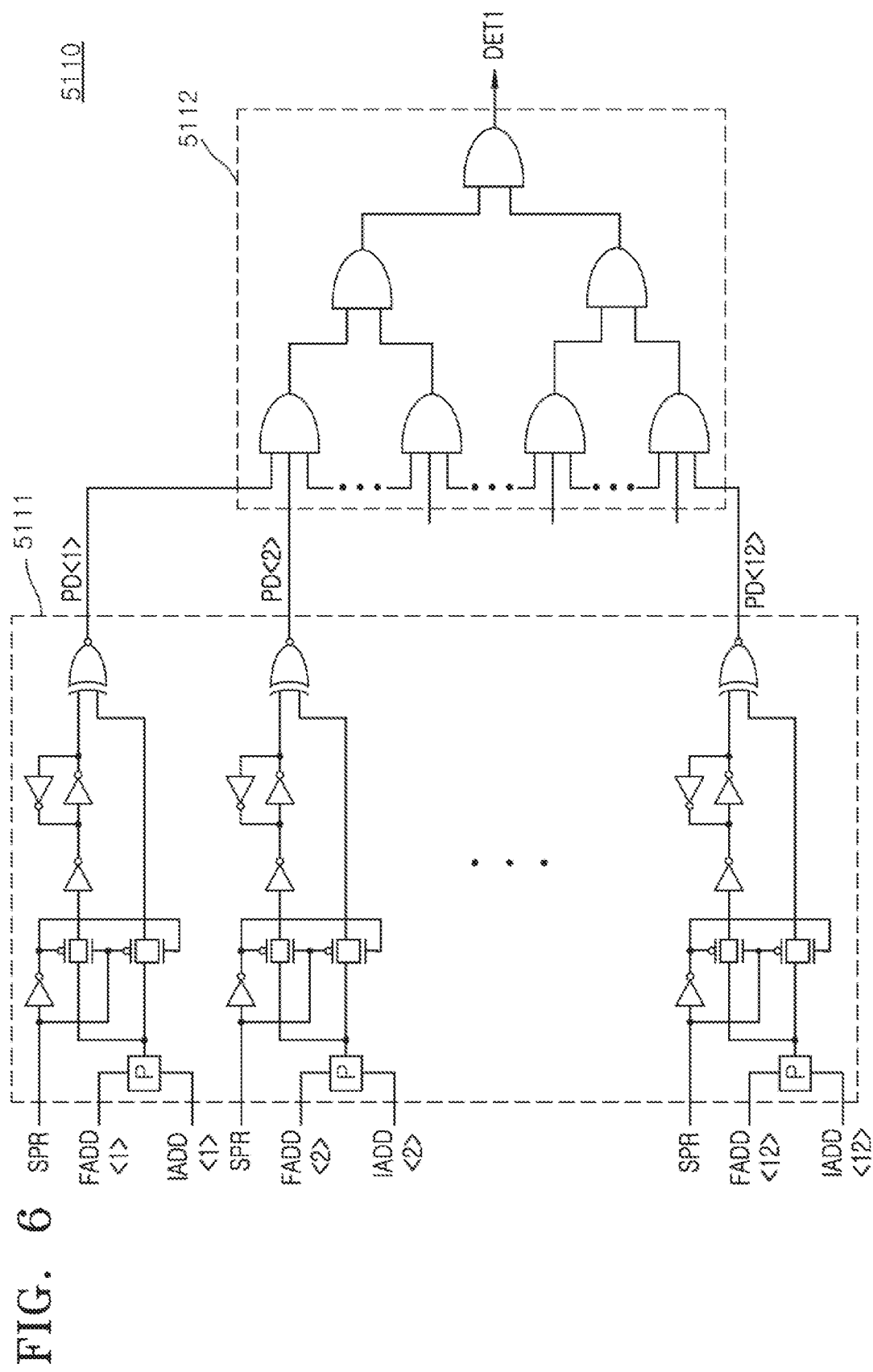
FIG. 6 shows a circuit diagram illustrating a configuration of the first detection signal generation circuit included in the first detection circuit shown in FIG. 5.

Referring to FIG. 6, the first detection signal generation circuit 5110 may include a first comparison circuit 5111 and a first detection signal output circuit 5112.

The first comparison circuit 5111 may store the first to twelfth failure addresses FADD<1:12> in response to the soft repair control signal SPR, and may generate first to twelfth pre-detection signals PD<1:12> by comparing the combinations of the stored first to twelfth failure addresses FADD<1:12> and the first to twelfth internal addresses IADD<1:12>. The first comparison circuit 5111 may store the first to twelfth failure addresses FADD<1:12> in the case where the soft repair control signal SPR is at the logic high level. The first comparison circuit 5111 may generate the first to twelfth pre-detection signals PD<1:12> by comparing the combinations of the stored first to twelfth failure addresses FADD<1:12> and the first to twelfth internal addresses IADD<1:12>, in the case where the soft repair control signal SPR is at the logic low level. For example, in the case where the first failure address FADD<1> and the first internal address IADD<1> are the same logic level, the first pre-detection signal PD<1> is generated at a logic high level.

The first detection signal output circuit 5112 may generate the first detection signal DET1 in response to the first to twelfth pre-detection signals PD<1:12>. The first detection signal output circuit 5112 may generate the first detection signal DET1 which is enabled to a logic high level, in the case where all the first to twelfth pre-detection signals PD<1:12> are logic high levels. The first detection signal output circuit 5112 may generate the first detection signal DET1 which is disabled to a logic low level, in the case where any one of the first to twelfth pre-detection signals PD<1:12> is at a logic low level.

Figure 7:
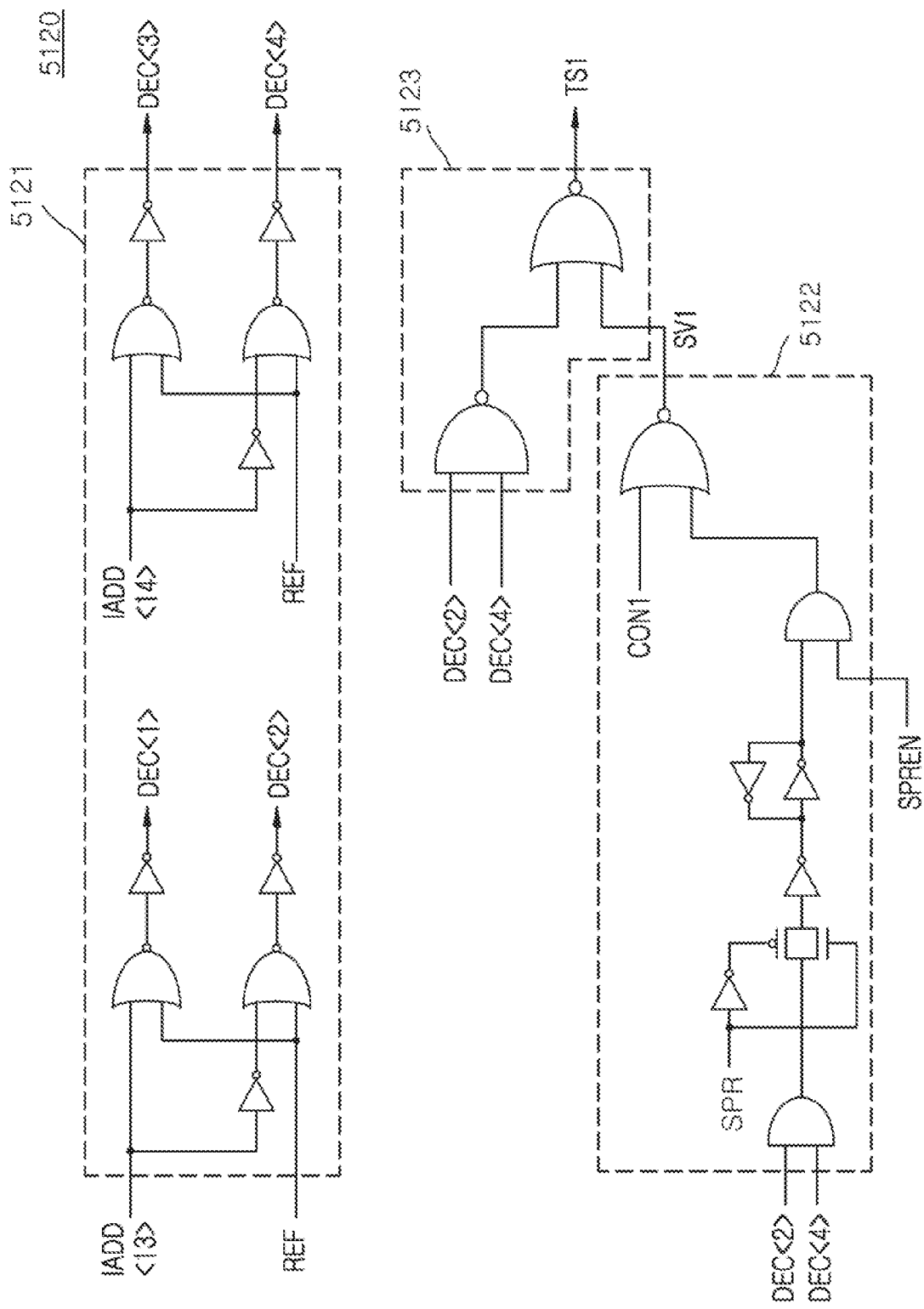
FIG. 7 shows a circuit diagram illustrating a configuration of the first transfer signal generation circuit included in the first detection circuit shown in FIG. 5.

Referring to FIG. 7, the first transfer signal generation circuit 5120 may include a first decoder 5121, a first storage circuit 5122, and a first transfer signal output circuit 5123.

The first decoder 5121 may generate first to fourth decoding signals DEC<1:4> by decoding the thirteenth internal address IADD<13> and the fourteenth internal address IADD<14> in response to the refresh signal REF. The first decoder 5121 may generate the first to fourth decoding signals DEC<1:4>, all of which have logic high levels, in the case where the refresh signal REF is inputted at a logic high level. The first decoder 5121 may generate the second decoding signal DEC<2> and the fourth decoding signal DEC<4>, which are enabled to the logic high levels, in the case where the refresh signal REF is inputted at a logic low level and the thirteenth internal address IADD<13> and the fourteenth internal address IADD<14> have the first combination.

The first storage circuit 5122 may store the second decoding signal DEC<2> and the fourth decoding signal DEC<4> in response to the soft repair control signal SPR. The first storage circuit 5122 may generate a first storage signal SV1 which is enabled to a logic low level, in the case where both the stored second decoding signal DEC<2> and fourth decoding signal DEC<4> are enabled to the logic high levels in response to the enable signal SPREN. The first storage circuit 5122 may generate the first storage signal SV1 which is disabled to a logic high level, in the case where any one of the stored second decoding signal DEC<2> and fourth decoding signal DEC<4> is at a logic low level in response to the enable signal SPREN and a first control signal CON1 is at a logic low level. The first control signal CON1 may be set as a signal which is enabled to a logic high level in the case where all the first to twelfth failure addresses FADD<1:12> are logic low levels.

The first transfer signal output circuit 5123 may output the first storage signal SV1 as the first transfer signal TS1 in response to the second decoding signal DEC<2> and the fourth decoding signal DEC<4>. The first transfer signal output circuit 5123 may output the first transfer signal TS1 by inverting and buffering the first storage signal SV1 in the case where both the second decoding signal DEC<2> and the fourth decoding signal DEC<4> are the logic high levels.

Figure 8:
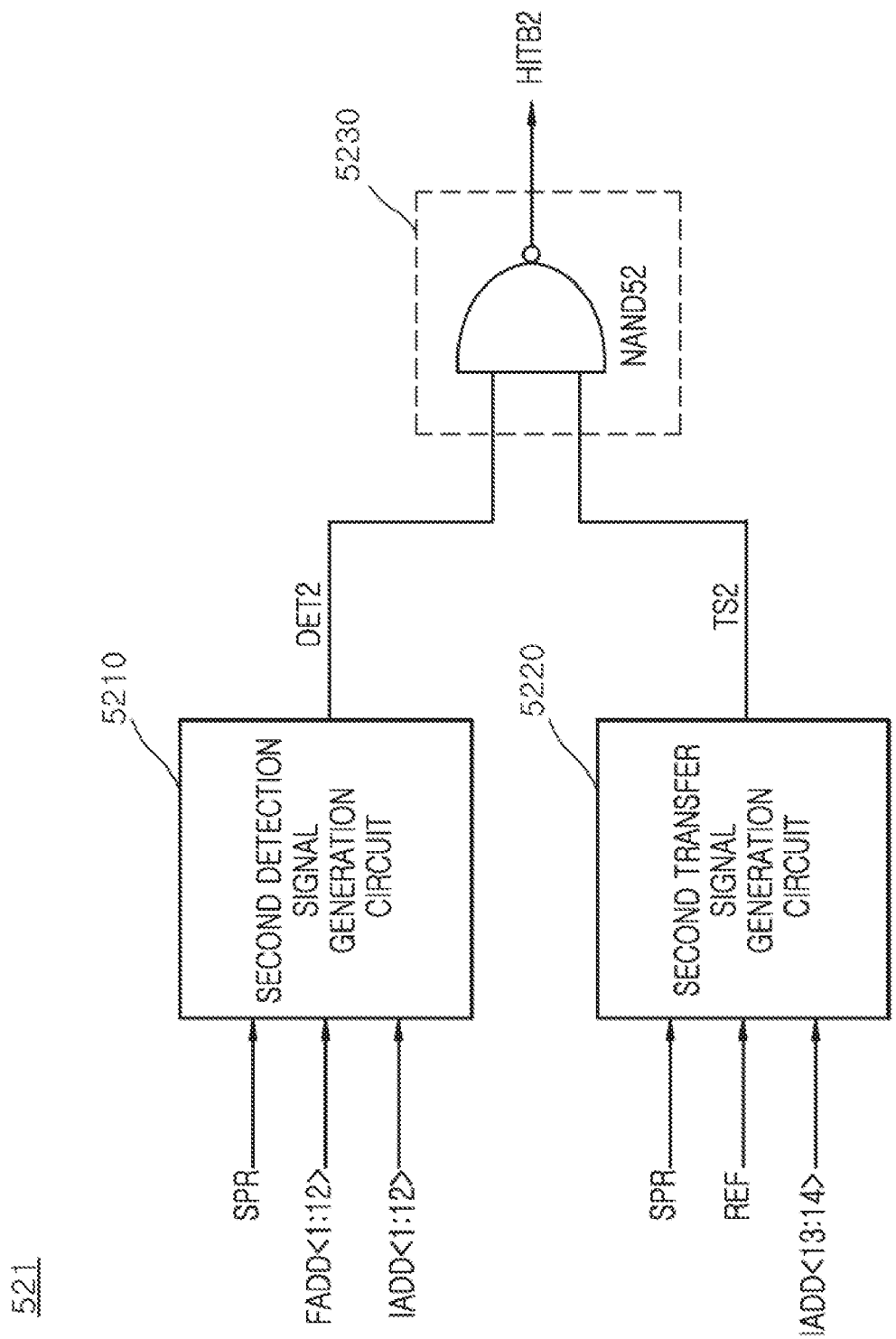
FIG. 8 shows a diagram illustrating a configuration of the second detection circuit included in the second region shown in FIG. 3.

Referring to FIG. 8, the second detection circuit 521 may include a second detection signal generation circuit 5210, a second transfer signal generation circuit 5220, and a second logic circuit 5230.

The second detection signal generation circuit 5210 may generate a second detection signal DET2 by comparing the first to twelfth failure addresses FADD<1:12> and the first to twelfth internal addresses IADD<1:12> in response to the soft repair control signal SPR. The second detection signal generation circuit 5210 may store the first to twelfth failure addresses FADD<1:12> in response to the soft repair control signal SPR. The second detection signal generation circuit 5210 may generate the second detection signal DET2 by comparing the stored first to twelfth failure addresses FADD<1:12> and the first to twelfth internal addresses IADD<1:12>.

The second transfer signal generation circuit 5220 may store the thirteenth and fourteenth internal addresses IADD<13:14> in response to the soft repair control signal SPR. The second transfer signal generation circuit 5220 may generate a second transfer signal TS2 depending on the logic levels of the thirteenth and fourteenth internal addresses IADD<13:14> stored in response to the refresh signal REF and the soft repair control signal SPR. The second transfer signal generation circuit 5220 may generate the second transfer signal TS2 of a logic high level in the case where the soft repair control signal SPR is at the logic low level and the stored thirteenth and fourteenth internal addresses IADD<13:14> have the second combination.

The second logic circuit 5230 may be implemented by a NAND gate NAND52. The second logic circuit 5230 may generate the second repair signal HITB2 by inverting and buffering the second detection signal DET2 in response to the second transfer signal TS2. The second logic circuit 5230 may generate the second repair signal HITB2 by inverting and buffering the second detection signal DET2, in the case where the second transfer signal TS2 is at the logic high level. The second logic circuit 5230 may generate the second repair signal HITB2 by performing a NAND logic operation on the second transfer signal TS2 and the second detection signal DET2.

Meanwhile, because the second detection signal generation circuit 5210 is implemented by substantially the same circuit and performs substantially the same operation as the first detection signal generation circuit 5110 shown in FIG. 6, a detailed description thereof is omitted herein.

Figure 9:
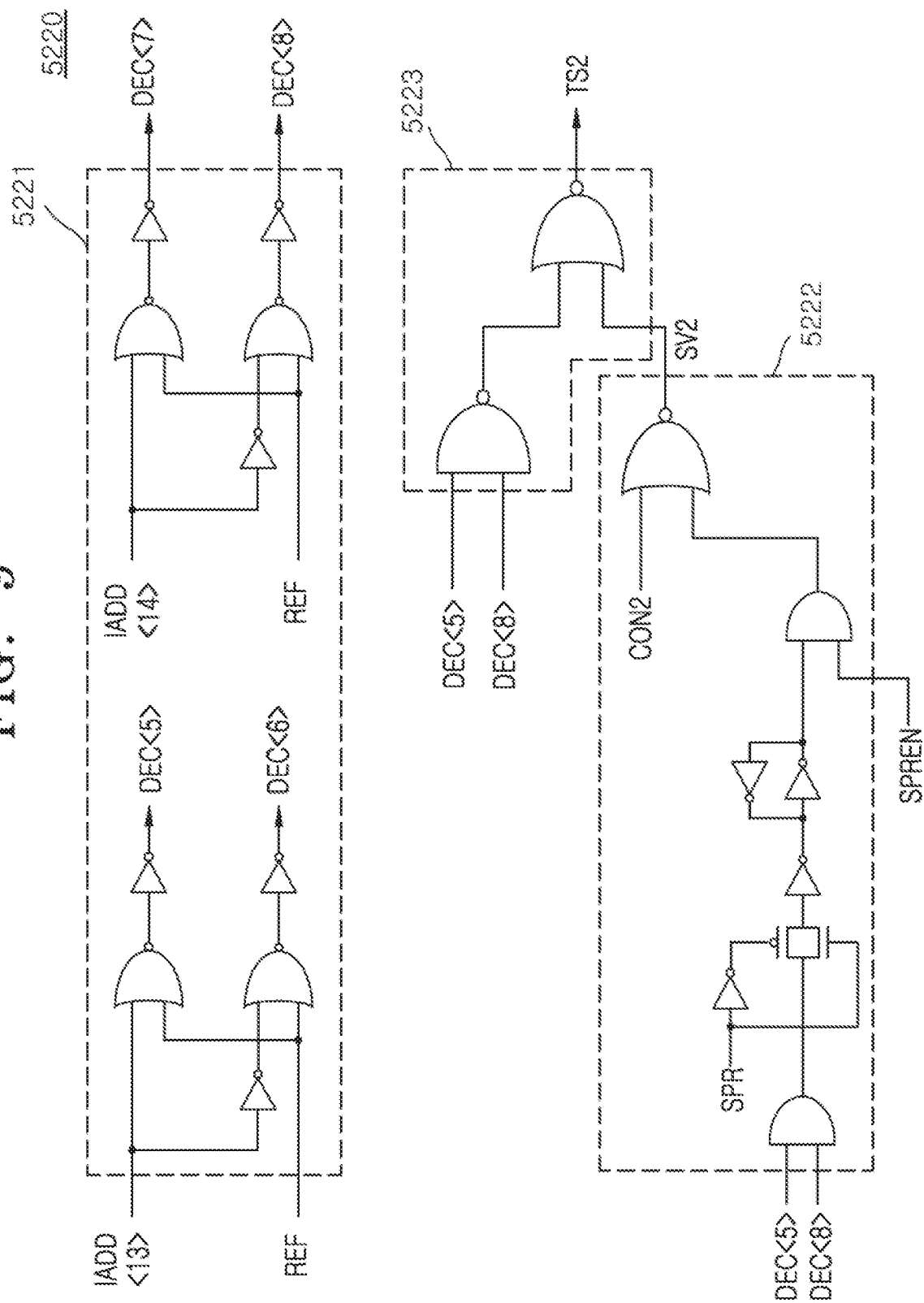
FIG. 9 shows a circuit diagram illustrating a configuration of the second transfer signal generation circuit included in the second detection circuit shown in FIG. 8.

Referring to FIG. 9, the second transfer signal generation circuit 5220 may include a second decoder 5221, a second storage circuit 5222, and a second transfer signal output circuit 5223.

The second decoder 5221 may generate fifth to eighth decoding signals DEC<5:8> by decoding the thirteenth internal address IADD<13> and the fourteenth internal address IADD<14> in response to the refresh signal REF. The second decoder 5221 may generate the fifth to eighth decoding signals DEC<5:8>, all of which have logic high levels, in the case where the refresh signal REF is inputted at the logic high level. The second decoder 5221 may generate the fifth decoding signal DEC<5> and the eighth decoding signal DEC<8> which are enabled to the logic high levels, in the case where the refresh signal REF is inputted at the logic low level and the thirteenth internal address IADD<13> and the fourteenth internal address IADD<14> have the second combination.

The second storage circuit 5222 may store the fifth decoding signal DEC<5> and the eighth decoding signal DEC<8> in response to the soft repair control signal SPR. The second storage circuit 5222 may generate a second storage signal SV2 which is enabled to a logic low level, in the case where both the stored fifth decoding signal DEC<5> and eighth decoding signal DEC<8> are enabled to the logic high levels in response to the enable signal SPREN. The second storage circuit 5222 may generate the second storage signal SV2 which is disabled to a logic high level, in the case where any one of the stored fifth decoding signal DEC<5> and eighth decoding signal DEC<8> is at a logic low level in response to the enable signal SPREN and a second control signal CON2 is at a logic low level. The second control signal CON2 may be set as a signal which is enabled to a logic high level in the case where all the first to twelfth failure addresses FADD<1:12> are the logic low levels.

The second transfer signal output circuit 5223 may output the second storage signal SV2 as the second transfer signal TS2 in response to the fifth decoding signal DEC<5> and the eighth decoding signal DEC<8>. The second transfer signal output circuit 5223 may output the second transfer signal TS2 by inverting and buffering the second storage signal SV2 in the case where both the fifth decoding signal DEC<5> and the eighth decoding signal DEC<8> are the logic high levels.

Figure 10:
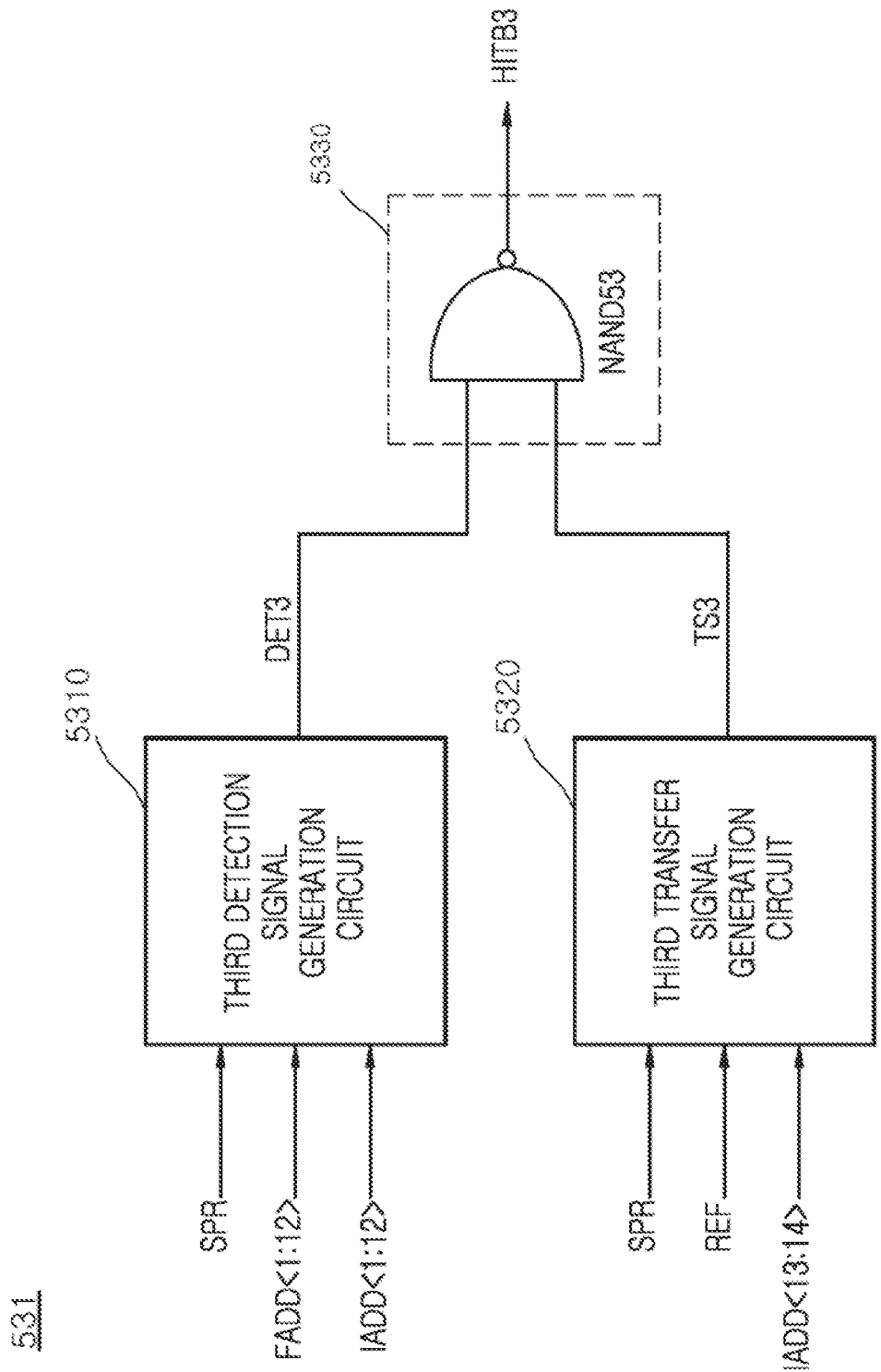
FIG. 10 shows a diagram illustrating a configuration of the third detection circuit included in the third region shown in FIG. 3.

Referring to FIG. 10, the third detection circuit 531 may include a third detection signal generation circuit 5310, a third transfer signal generation circuit 5320, and a third logic circuit 5330.

The third detection signal generation circuit 5310 may generate a third detection signal DET3 by comparing the first to twelfth failure addresses FADD<1:12> and the first to twelfth internal addresses IADD<1:12> in response to the soft repair control signal SPR. The third detection signal generation circuit 5310 may store the first to twelfth failure addresses FADD<1:12> in response to the soft repair control signal SPR. The third detection signal generation circuit 5310 may generate the third detection signal DET3 by comparing the stored first to twelfth failure addresses FADD<1:12> and the first to twelfth internal addresses IADD<1:12>.

The third transfer signal generation circuit 5320 may store the thirteenth and fourteenth internal addresses IADD<13:14> in response to the soft repair control signal SPR. The third transfer signal generation circuit 5320 may generate a third transfer signal TS3 depending on the logic levels of the thirteenth and fourteenth internal addresses IADD<13:14> stored in response to the refresh signal REF and the soft repair control signal SPR. The third transfer signal generation circuit 5320 may generate the third transfer signal TS3 of a logic high level in the case where the soft repair control signal SPR is at the logic low level and the stored thirteenth and fourteenth internal addresses IADD<13:14> have the third combination.

The third logic circuit 5330 may be implemented by a NAND gate NAND53. The third logic circuit 5330 may generate the third repair signal HITB3 by inverting and buffering the third detection signal DET3 in response to the third transfer signal TS3. The third logic circuit 5330 may generate the third repair signal HITB3 by inverting and buffering the third detection signal DET3, in the case where the third transfer signal TS3 is at the logic high level. The third logic circuit 5330 may generate the third repair signal HITB3 by performing a NAND logic operation on the third transfer signal TS3 and the third detection signal DET3.

Meanwhile, because the third detection signal generation circuit 5310 is implemented by substantially the same circuit and performs substantially the same operation as the first detection signal generation circuit 5110 shown in FIG. 6, a detailed description thereof is omitted herein.

Figure 11:
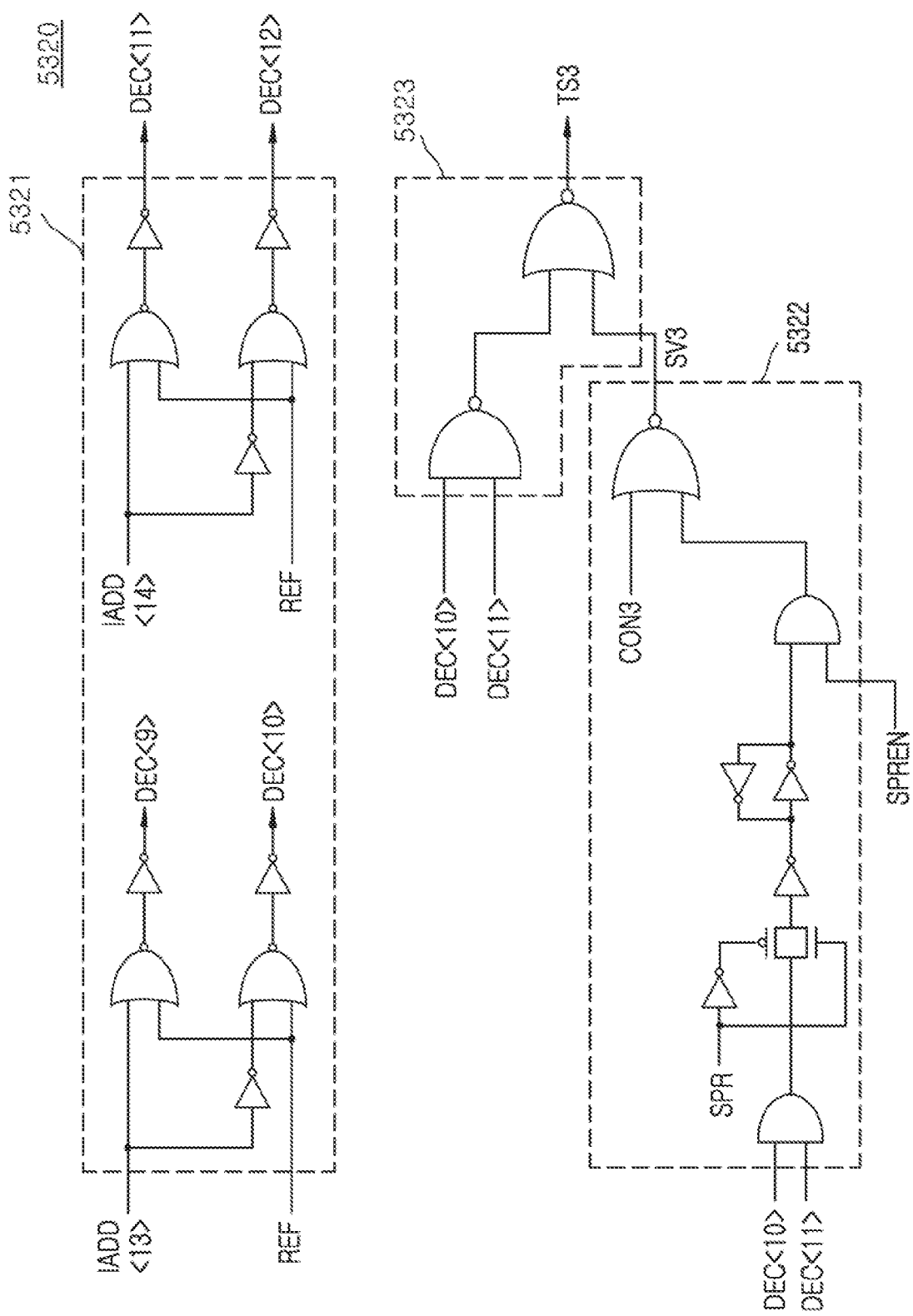
FIG. 11 shows a circuit diagram illustrating a configuration of the third transfer signal generation circuit included in the third detection circuit shown in FIG. 10.

Referring to FIG. 11, the third transfer signal generation circuit 5320 may include a third decoder 5321, a third storage circuit 5322, and a third transfer signal output circuit 5323.

The third decoder 5321 may generate ninth to twelfth decoding signals DEC<9:12> by decoding the thirteenth internal address IADD<13> and the fourteenth internal address IADD<14> in response to the refresh signal REF. The third decoder 5321 may generate the ninth to twelfth decoding signals DEC<9:12>, all of which have logic high levels, in the case where the refresh signal REF is inputted at the logic high level. The third decoder 5321 may generate the tenth decoding signal DEC<10> and the eleventh decoding signal DEC<11> which are enabled to the logic high levels, in the case where the refresh signal REF is inputted at the logic low level and the thirteenth internal address IADD<13> and the fourteenth internal address IADD<14> have the third combination.

The third storage circuit 5322 may store the tenth decoding signal DEC<10> and the eleventh decoding signal DEC<11> in response to the soft repair control signal SPR. The third storage circuit 5322 may generate a third storage signal SV3 which is enabled to a logic low level, in the case where both the stored tenth decoding signal DEC<10> and eleventh decoding signal DEC<11> are enabled to the logic high levels in response to the enable signal SPREN. The third storage circuit 5322 may generate the third storage signal SV3 which is disabled to a logic high level, in the case where any one of the stored tenth decoding signal DEC<10> and eleventh decoding signal DEC<11> is at a logic low level in response to the enable signal SPREN and a third control signal CON3 is at a logic low level. The third control signal CON3 may be set as a signal which is enabled to a logic high level in the case where all the first to twelfth failure addresses FADD<1:12> are the logic low levels.

The third transfer signal output circuit 5323 may output the third storage signal SV3 as the third transfer signal TS3 in response to the tenth decoding signal DEC<10> and the eleventh decoding signal DEC<11>. The third transfer signal output circuit 5323 may output the third transfer signal TS3 by inverting and buffering the third storage signal SV3 in the case where both the tenth decoding signal DEC<10> and the eleventh decoding signal DEC<11> are the logic high levels.

Figure 12:
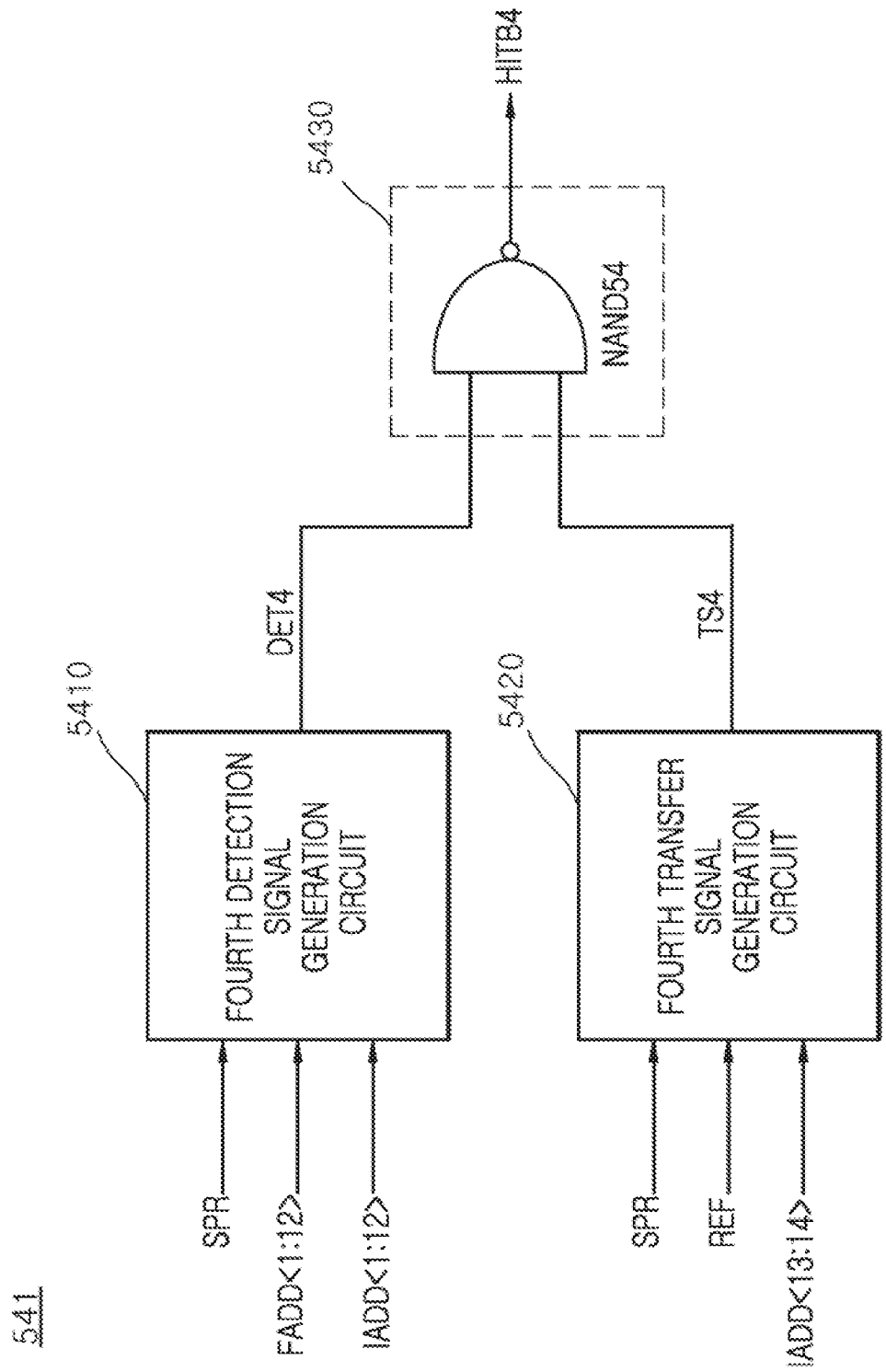
FIG. 12 shows a diagram illustrating a configuration of the fourth detection circuit included in the fourth region shown in FIG. 3.

Referring to FIG. 12, the fourth detection circuit 541 may include a fourth detection signal generation circuit 5410, a fourth transfer signal generation circuit 5420, and a fourth logic circuit 5430.

The fourth detection signal generation circuit 5410 may generate a fourth detection signal DET4 by comparing the first to twelfth failure addresses FADD<1:12> and the first to twelfth internal addresses IADD<1:12> in response to the soft repair control signal SPR. The fourth detection signal generation circuit 5410 may store the first to twelfth failure addresses FADD<1:12> in response to the soft repair control signal SPR. The fourth detection signal generation circuit 5410 may generate the fourth detection signal DET4 by comparing the stored first to twelfth failure addresses FADD<1:12> and the first to twelfth internal addresses IADD<1:12>.

The fourth transfer signal generation circuit 5420 may store the thirteenth and fourteenth internal addresses IADD<13:14> in response to the soft repair control signal SPR. The fourth transfer signal generation circuit 5420 may generate a fourth transfer signal TS4 depending on the logic levels of the thirteenth and fourteenth internal addresses IADD<13:14> stored in response to the refresh signal REF and the soft repair control signal SPR. The fourth transfer signal generation circuit 5420 may generate the fourth transfer signal TS4 of a logic high level in the case where the soft repair control signal SPR is at the logic low level and the stored thirteenth and fourteenth internal addresses IADD<13:14> have the fourth combination.

The fourth logic circuit 5430 may be implemented by a NAND gate NAND54. The fourth logic circuit 5430 may generate the fourth repair signal HITB4 by inverting and buffering the fourth detection signal DET4 in response to the fourth transfer signal TS4. The fourth logic circuit 5430 may generate the fourth repair signal HITB4 by inverting and buffering the fourth detection signal DET4, in the case where the fourth transfer signal TS4 is at the logic high level. The fourth logic circuit 5430 may generate the fourth repair signal HITB4 by performing a NAND logic operation on the fourth transfer signal TS4 and the fourth detection signal DET4.

Meanwhile, because the fourth detection signal generation circuit 5410 is implemented by substantially the same circuit and performs substantially the same operation as the first detection signal generation circuit 5110 shown in FIG. 6, a detailed description thereof is omitted herein.

Figure 13:
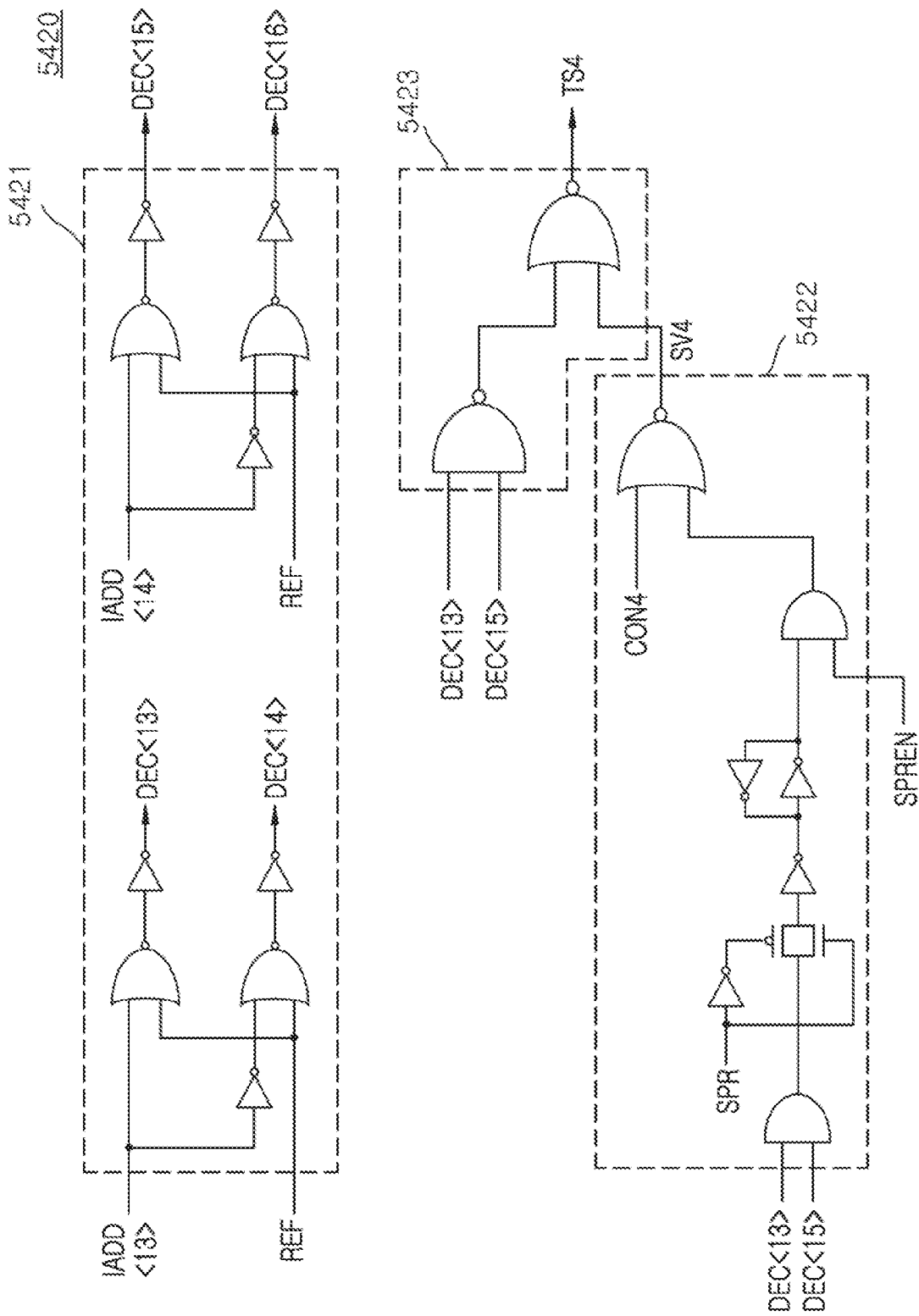
FIG. 13 shows a circuit diagram illustrating a configuration of the fourth transfer signal generation circuit included in the fourth detection circuit shown in FIG. 12.

Referring to FIG. 13, the fourth transfer signal generation circuit 5420 may include a fourth decoder 5421, a fourth storage circuit 5422, and a fourth transfer signal output circuit 5423.

The fourth decoder 5421 may generate thirteenth to sixteenth decoding signals DEC<13:16> by decoding the thirteenth internal address IADD<13> and the fourteenth internal address IADD<14> in response to the refresh signal REF. The fourth decoder 5421 may generate the thirteenth to sixteenth decoding signals DEC<13:16>, all of which have logic high levels, in the case where the refresh signal REF is inputted at the logic high level. The fourth decoder 5421 may generate the thirteenth decoding signal DEC<13> and the fifteenth decoding signal DEC<15> which are enabled to the logic high levels, in the case where the refresh signal REF is inputted at the logic low level and the thirteenth internal address IADD<13> and the fourteenth internal address IADD<14> have the fourth combination.

The fourth storage circuit 5422 may store the thirteenth decoding signal DEC<13> and the fifteenth decoding signal DEC<15> in response to the soft repair control signal SPR. The fourth storage circuit 5422 may generate a fourth storage signal SV4 which is enabled to a logic low level, in the case where both the stored thirteenth decoding signal DEC<13> and fifteenth decoding signal DEC<15> are enabled to the logic high levels in response to the enable signal SPREN. The fourth storage circuit 5422 may generate the fourth storage signal SV4 which is disabled to a logic high level, in the case where any one of the stored thirteenth decoding signal DEC<13> and fifteenth decoding signal DEC<15> is at a logic low level in response to the enable signal SPREN and a fourth control signal CON4 is at a logic low level. The fourth control signal CON4 may be set as a signal which is enabled to a logic high level in the case where all the first to twelfth failure addresses FADD<1:12> are the logic low levels.

The fourth transfer signal output circuit 5423 may output the fourth storage signal SV4 as the fourth transfer signal TS4 in response to the thirteenth decoding signal DEC<13> and the fifteenth decoding signal DEC<15>. The fourth transfer signal output circuit 5423 may output the fourth transfer signal TS4 by inverting and buffering the fourth storage signal SV4 in the case where both the thirteenth decoding signal DEC<13> and the fifteenth decoding signal DEC<15> are the logic high levels.

The refresh operation of the semiconductor device 100 in accordance with the embodiment is described below with reference to FIGS. 1 to 13, by taking as examples operations in the case where a failure does not occur in the plurality of word lines WL in the soft repair operation and in the case where a failure occurs in a word line WL included in the first region 51 among the plurality of word lines WL.

First, the operation in the case where a failure does not occur in the plurality of word lines WL in the soft repair operation during the refresh operation is described below.

The command decoder 1 generates the boot-up signal BOOT by decoding the command CMD.

The fuse circuit 2 outputs the first to fourteenth failure addresses FADD<1:14> in response to the boot-up signal BOOT. Because a failure does not occur in the plurality of word lines WL, all the first to fourteenth failure addresses FADD<1:14> are generated at the logic low levels.

The command decoder 1 generates the refresh signal REF by decoding the command CMD.

The address generation circuit 3 sequentially counts the first to fourteenth internal addresses IADD<1:14> in response to the refresh signal REF.

The soft repair control circuit 4 generates the enable signal SPREN which is disabled to the logic low level, by comparing the first to twelfth internal addresses IADD<1: 12> and the first to twelfth failure addresses FADD<1:12> in response to the soft repair control signal SPR.

The first word line group 513 of the first region 51 performs the refresh operation as one among the plurality of word lines WL is activated by the first to twelfth internal addresses IADD<1:12>.

The second word line group 523 of the second region 52 performs the refresh operation as one among the plurality of word lines WL is activated by the first to twelfth internal addresses IADD<1:12>.

The third word line group 533 of the third region 53 performs the refresh operation as one among the plurality of word lines WL is activated by the first to twelfth internal addresses IADD<1:12>.

The fourth word line group 543 of the fourth region 54 performs the refresh operation as one among the plurality of word lines WL is activated by the first to twelfth internal addresses IADD<1:12>.

In this way, in the case where a failure does not occur in the plurality of word lines WL in the soft repair operation during the refresh operation, the semiconductor device 100 in accordance with the embodiment performs the refresh operation as the word lines WL included in the first to fourth regions 51 to 54 are simultaneously activated by one in each region.

Next, the operation in the case where a failure occurs in a word line WL included in the first region 51 among the plurality of word lines WL in the soft repair operation during the refresh operation is described below.

The command decoder 1 generates the boot-up signal BOOT by decoding the command CMD.

The fuse circuit 2 outputs the first to fourteenth failure addresses FADD<1:14> in response to the boot-up signal BOOT. The first to fourteenth failure addresses FADD<1: 14> are generated to include the position information of the word line WL in which a failure has occurred, among the plurality of word lines WL of the first region 51.

The command decoder 1 generates the refresh signal REF by decoding the command CMD.

The address generation circuit 3 generates the first to fourteenth internal addresses IADD<1:14> in response to the refresh signal REF. The first to fourteenth internal addresses IADD<1:14> are generated to include the position information of the word line WL in which a failure has occurred, among the plurality of word lines WL of the first region 51.

The soft repair control circuit 4 generates the enable signal SPREN which is enabled to the logic high level, by comparing the first to twelfth internal addresses IADD<1: 12> and the first to twelfth failure addresses FADD<1:12> in response to the soft repair control signal SPR.

The first detection circuit 511 of the first region 51 generates the first repair signal HITB1 which is enabled to the logic low level, by comparing the first to twelfth failure addresses FADD<1:12> and the first to twelfth internal addresses IADD<1:12>, because the thirteenth and fourteenth internal addresses IADD<13:14> have the first combination in response to the refresh signal REF and the enable signal SPREN.

The first repair circuit 512 of the first region 51 replaces a word line WL which is activated by the first to twelfth internal addresses IADD<1:12>, with a redundancy word line RWL, in response to the first repair signal HITB1 which is enabled to the logic low level.

The second detection circuit 521 of the second region 52 generates the second repair signal HITB2 which is disabled to the logic high level, because the thirteenth and fourteenth internal addresses IADD<13:14> do not have the second combination in response to the refresh signal REF and the enable signal SPREN.

The second repair circuit 522 of the second region 52 does not replace a word line WL which is activated by the first to twelfth internal addresses IADD<1:12>, with a redundancy word line RWL, in response to the second repair signal HITB2 which is disabled to the logic high level.

The third detection circuit 531 of the third region 53 generates the third repair signal HITB3 which is disabled to the logic high level, because the thirteenth and fourteenth internal addresses IADD<13:14> do not have the third combination in response to the refresh signal REF and the enable signal SPREN.

The third repair circuit 532 of the third region 53 does not replace a word line WL which is activated by the first to twelfth internal addresses IADD<1:12>, with a redundancy word line RWL, in response to the third repair signal HITB3 which is disabled to the logic high level.

The fourth detection circuit 541 of the fourth region 54 generates the fourth repair signal HITB4 which is disabled to the logic high level, because the thirteenth and fourteenth internal addresses IADD<13:14> do not have the fourth combination in response to the refresh signal REF and the enable signal SPREN.

The fourth repair circuit 542 of the fourth region 54 does not replace a word line WL which is activated by the first to twelfth internal addresses IADD<1:12>, with a redundancy word line RWL, in response to the fourth repair signal HITB4 which is disabled to the logic high level.

As is apparent from the above descriptions, a semiconductor device according to an embodiment of the present disclosure may store internal addresses including information on a region selected among a plurality of regions included in a core circuit, in a soft repair operation during a refresh operation, and may perform a repair operation in only a region selectively activated by the stored internal addresses, thereby preventing a repetitive repair operation by a failure address.

Figure 14:
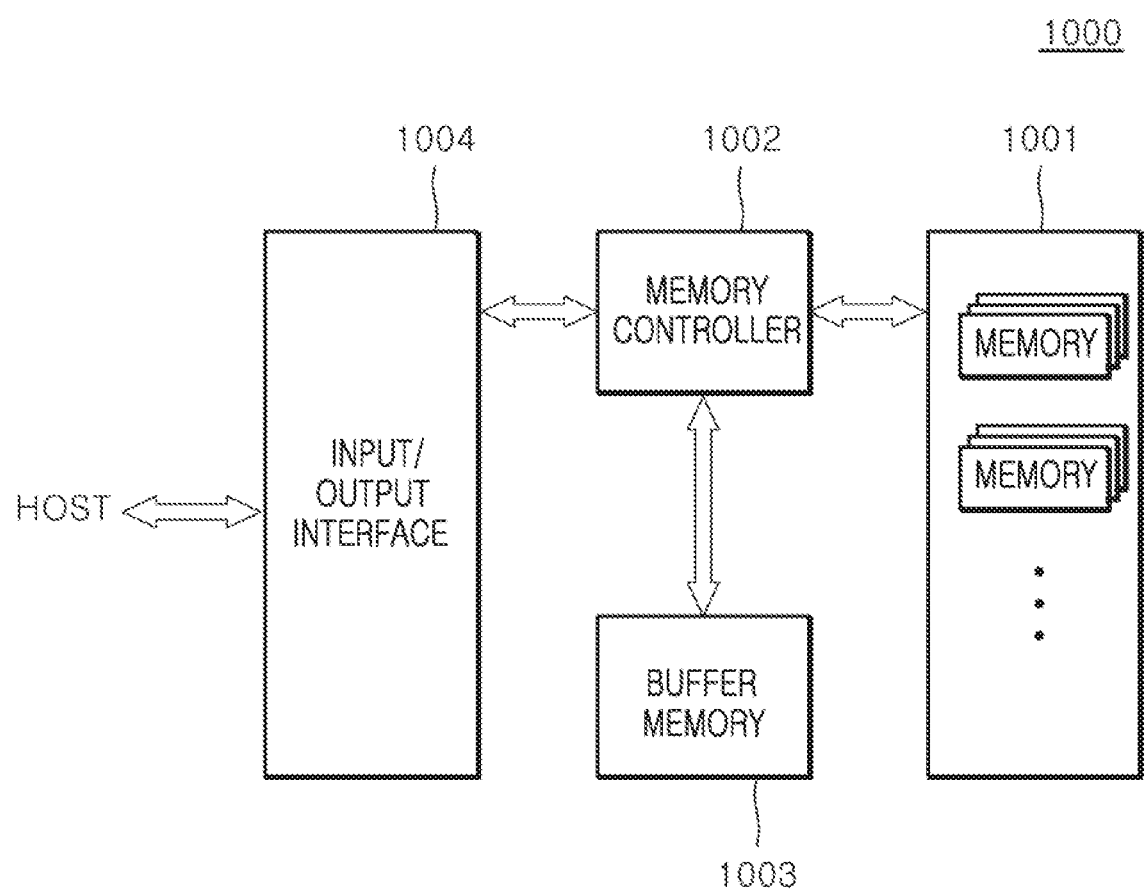
FIG. 14 shows a diagram illustrating a configuration of an electronic system to which the semiconductor device shown in FIGS. 1 to 13 is applied.

The semiconductor device 100 described above with reference to FIGS. 1 to 13 may be applied to an electronic system which includes a memory system, a graphic system, a computing system, or a mobile system. For example, referring to FIG. 14, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the semiconductor device 100 shown in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 14, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood by those skilled in the art that the embodiments described are by way of example only. Accordingly, the semiconductor device 100 described herein should not be limited based on the described embodiments.

What is claimed is:

1. A semiconductor device comprising:
    a soft repair control circuit configured to generate an enable signal, in response to a soft repair control signal, wherein the enable signal is enabled when first and second internal addresses counted in a refresh operation have the same combination as first and second failure addresses; and
    a core circuit comprising first, second, third, and fourth regions each including a plurality of word lines which are activated based on a combination of the first, the second, third and fourth internal addresses, wherein the core circuit is configured to repair, in response to the enable signal, a word line in which a failure has occurred and which is included in a region selected among the first, second, third, and fourth regions by the third and fourth internal addresses.

2. The semiconductor device according to claim 1, wherein the soft repair control signal is enabled to enter a soft repair operation, during the refresh operation, of repairing a word line in which a failure has occurred.

3. The semiconductor device according to claim 1, wherein the core circuit repairs, when the enable signal is disabled, a word line, among the plurality of word lines, in which a failure has occurred, based on a combination of the first and second failure addresses.

4. The semiconductor device according to claim 1, wherein the first and second internal addresses represent bits for activating the word line, and the third and fourth internal addresses represent bits for selecting at least one of the first, second, third, and fourth regions.

5. The semiconductor device according to claim 1, wherein the soft repair control circuit comprises:
    a comparison signal generation circuit configured to store the first and second failure addresses in response to the soft repair control signal, and configured to generate first and second comparison signals by comparing combinations of the stored first and second failure addresses and the first and second internal addresses; and
    an enable signal generation circuit configured to generate the enable signal, wherein the enable signal is enabled when both the first and second comparison signals are enabled.

6. The semiconductor device according to claim 5, wherein the first comparison signal is enabled when logic levels of the first failure address and the first internal address are the same, and the second comparison signal is enabled when logic levels of the second failure address and the second internal address are the same.

7. The semiconductor device according to claim 1, wherein the first region comprises:
    a first detection circuit configured to generate a first repair signal by comparing the first and second failure addresses and the first and second internal addresses when the third and fourth internal addresses have a first combination in response to a refresh signal and the enable signal;
    a first repair circuit configured to replace, in response to the first repair signal, a word line activated by the first and second internal addresses with a redundancy word line;
    a first word line group comprising the plurality of word lines selected by the first and second internal addresses; and
    a first redundancy word line group comprising a redundancy word line which replaces a word line, among the plurality of word lines of the first word line group, in which a failure has occurred.

8. The semiconductor device according to claim 1, wherein the second region comprises:
- a second detection circuit configured to generate a second repair signal by comparing the first and second failure addresses and the first and second internal addresses when the third and fourth internal addresses have a second combination in response to the refresh signal and the enable signal;
- a second repair circuit configured to replace, in response to the second repair signal, a word line activated by the first and second internal addresses with a redundancy word line;
- a second word line group comprising the plurality of word lines selected by the first and second internal addresses; and
- a second redundancy word line group comprising a redundancy word line which replaces a word line, among the plurality of word lines of the second word line group, in which a failure has occurred.

9. The semiconductor device according to claim 1, wherein the third region comprises:
- a third detection circuit configured to generate a third repair signal by comparing the first and second failure addresses and the first and second internal addresses when the third and fourth internal addresses have a third combination in response to the refresh signal and the enable signal;
- a third repair circuit configured to replace, in response to the third repair signal, a word line activated by the first and second internal addresses with a redundancy word line;
- a third word line group comprising the plurality of word lines selected by the first and second internal addresses; and
- a third redundancy word line group comprising a redundancy word line which replaces a word line, among the plurality of word lines of the third word line group, in which a failure has occurred.

10. The semiconductor device according to claim 1, wherein the fourth region comprises:
- a fourth detection circuit configured to generate a fourth repair signal by comparing the first and second failure addresses and the first and second internal addresses when the third and fourth internal addresses have a fourth combination in response to the refresh signal and the enable signal;
- a fourth repair circuit configured to replace, in response to the fourth repair signal, a word line activated by the first and second internal addresses with a redundancy word line;
- a fourth word line group comprising the plurality of word lines selected by the first and second internal addresses; and
- a fourth redundancy word line group comprising a redundancy word line which replaces a word line, among the plurality of word lines of the fourth word line group, in which a failure has occurred.

11. A semiconductor device comprising first, second, third, and fourth regions which each include a plurality of word lines and a plurality of redundancy word lines, wherein at least one of the first, second, third, and fourth regions are selectively activated depending on first, second, third, and fourth internal addresses in a refresh operation in response to an enable signal, and wherein a word line in which a failure has occurred and which is included in a region activated among the first, second, third, and fourth regions depending on the first, second, third, and fourth internal addresses is repaired, and
wherein the enable signal is enabled when the first, second, third, and fourth internal addresses and first, second, third, and fourth failure addresses including position information of a word line in which a failure has occurred have the same combination in a soft repair operation.

12. The semiconductor device according to claim 11, wherein the first and second internal addresses represent bits for activating the plurality of word lines, and the third and fourth internal addresses represent bits for selecting at least one of the first, second, third, and fourth regions.

13. The semiconductor device according to claim 11, wherein the first region comprises:
- a first detection circuit configured to generate a first repair signal by comparing first and second failure addresses and the first and second internal addresses when the third and fourth internal addresses have a first combination, in response to a refresh signal and the enable signal;
- a first repair circuit configured to replace, in response to the first repair signal, a word line activated by the first and second internal addresses with a redundancy word line;
- a first word line group comprising the plurality of word lines selected by the first and second internal addresses; and
- a first redundancy word line group comprising a redundancy word line which replaces a word line, among the plurality of word lines of the first word line group, in which a failure has occurred.

14. The semiconductor device according to claim 13, wherein the first detection circuit comprises:
- a first detection signal generation circuit configured to generate a first detection signal by comparing the first and second failure addresses and the first and second internal addresses in response to a soft repair control signal;
- a first transfer signal generation circuit configured to store the third and fourth internal addresses in response to the refresh signal and the soft repair control signal, and configured to generate a first transfer signal depending on logic levels of the stored third and fourth internal addresses; and
- a first logic circuit configured to output the first repair signal by inverting and buffering the first detection signal in response to the first transfer signal.

15. The semiconductor device according to claim 14, wherein the first detection signal generation circuit comprises:
- a first comparison circuit configured to store the first and second failure addresses when the soft repair control signal is disabled, and configured to generate first and second pre-detection signals by comparing the stored first and second failure addresses and the first and second internal addresses when the soft repair control signal is enabled; and
- a first detection signal output circuit configured to generate the first detection signal, which is enabled when both the first and second pre-detection signals are enabled.

16. The semiconductor device according to claim 14, wherein the first transfer signal generation circuit comprises:

a first decoder configured to generate first, second, third, and fourth decoding signals by decoding the third and fourth internal addresses in response to the refresh signal;

a first storage circuit configured to store the second decoding signal and the fourth decoding signal in response to the soft repair control signal, and configured to generate a first storage signal which is enabled when both the second decoding signal and the fourth decoding signal are enabled in response to the enable signal; and a first transfer signal output circuit configured to output the first storage signal as the first transfer signal in response to the second decoding signal and the fourth decoding signal.

17. The semiconductor device according to claim 11, wherein the second region comprises:

a second detection circuit configured to generate a second repair signal by comparing first and second failure addresses and the first and second internal addresses when the third and fourth internal addresses have a second combination, in response to the refresh signal and the enable signal;

a second repair circuit configured to replace, in response to the second repair signal, a word line activated by the first and second internal addresses with a redundancy word line;

a second word line group comprising the plurality of word lines selected by the first and second internal addresses; and a second redundancy word line group comprising a redundancy word line which replaces a word line, among the plurality of word lines of the second word line group, in which a failure has occurred.

18. The semiconductor device according to claim 17, wherein the second detection circuit comprises:

a second detection signal generation circuit configured to generate a second detection signal by comparing the first and second failure addresses and the first and second internal addresses in response to the soft repair control signal;

a second transfer signal generation circuit configured to store the third and fourth internal addresses in response to the refresh signal and the soft repair control signal, and configured to generate a second transfer signal depending on logic levels of the stored third and fourth internal addresses; and a second logic circuit configured to output the second repair signal by inverting and buffering the second detection signal in response to the second transfer signal.

19. The semiconductor device according to claim 18, wherein the second detection signal generation circuit comprises:

a second comparison circuit configured to store the first and second failure addresses when the soft repair control signal is disabled, and configured to generate third and fourth pre-detection signals by comparing the stored first and second failure addresses and the first and second internal addresses when the soft repair control signal is enabled; and a second detection signal output circuit configured to generate the second detection signal, which is enabled when both the third and fourth pre-detection signals are enabled.

20. The semiconductor device according to claim 18, wherein the second transfer signal generation circuit comprises:

a second decoder configured to generate fifth, sixth, seventh, and eighth decoding signals by decoding the third and fourth internal addresses in response to the refresh signal;

a second storage circuit configured to store the fifth decoding signal and the eighth decoding signal in response to the soft repair control signal, and configured to generate a second storage signal which is enabled when both the fifth decoding signal and the eighth decoding signal are enabled in response to the enable signal; and a second transfer signal output circuit configured to output the second storage signal as the second transfer signal in response to the fifth decoding signal and the eighth decoding signal.

21. The semiconductor device according to claim 11, wherein the third region comprises:

a third detection circuit configured to generate a third repair signal by comparing first and second failure addresses and the first and second internal addresses when the third and fourth internal addresses have a third combination, in response to the refresh signal and the enable signal;

a third repair circuit configured to replace, in response to the third repair signal, a word line activated by the first and second internal addresses with a redundancy word line;

a third word line group comprising the plurality of word lines selected by the first and second internal addresses; and a third redundancy word line group comprising a redundancy word line which replaces a word line, among the plurality of word lines of the third word line group, in which a failure has occurred.

22. The semiconductor device according to claim 21, wherein the third detection circuit comprises:

a third detection signal generation circuit configured to generate a third detection signal by comparing the first and second failure addresses and the first and second internal addresses in response to the soft repair control signal;

a third transfer signal generation circuit configured to store the third and fourth internal addresses in response to the refresh signal and the soft repair control signal, and configured to generate a third transfer signal depending on logic levels of the stored third and fourth internal addresses; and a third logic circuit configured to output the third repair signal by inverting and buffering the third detection signal in response to the third transfer signal.

23. The semiconductor device according to claim 22, wherein the third detection signal generation circuit comprises:

a third comparison circuit configured to store the first and second failure addresses when the soft repair control signal is disabled, and configured to generate fifth and sixth pre-detection signals by comparing the stored first and second failure addresses and the first and second internal addresses when the soft repair control signal is enabled; and a third detection signal output circuit configured to generate the third detection signal, which is enabled when both the fifth and sixth pre-detection signals are enabled.

24. The semiconductor device according to claim 22, wherein the third transfer signal generation circuit comprises:
- a third decoder configured to generate ninth, tenth, eleventh, and twelfth decoding signals by decoding the third and fourth internal addresses in response to the refresh signal;
- a third storage circuit configured to store the tenth decoding signal and the eleventh decoding signal in response to the soft repair control signal, and configured to generate a third storage signal which is enabled when both the tenth decoding signal and the eleventh decoding signal are enabled in response to the enable signal; and
- a third transfer signal output circuit configured to output the third storage signal as the third transfer signal in response to the tenth decoding signal and the eleventh decoding signal.

25. The semiconductor device according to claim 11, wherein the fourth region comprises:
- a fourth detection circuit configured to generate a fourth repair signal by comparing first and second failure addresses and the first and second internal addresses when the third and fourth internal addresses have a fourth combination, in response to the refresh signal and the enable signal;
- a fourth repair circuit configured to replace, in response to the fourth repair signal, a word line activated by the first and second internal addresses with a redundancy word line;
- a fourth word line group comprising the plurality of word lines selected by the first and second internal addresses; and
- a fourth redundancy word line group comprising a redundancy word line which replaces a word line, among the plurality of word lines of the fourth word line group, in which a failure has occurred.

26. The semiconductor device according to claim 25, wherein the fourth detection circuit comprises:
- a fourth detection signal generation circuit configured to generate a fourth detection signal by comparing the first and second failure addresses and the first and second internal addresses in response to the soft repair control signal;
- a fourth transfer signal generation circuit configured to store the third and fourth internal addresses in response to the refresh signal and the soft repair control signal, and configured to generate a fourth transfer signal depending on logic levels of the stored third and fourth internal addresses; and
- a fourth logic circuit configured to output the fourth repair signal by inverting and buffering the fourth detection signal in response to the fourth transfer signal.

27. The semiconductor device according to claim 26, wherein the fourth detection signal generation circuit comprises:
- a fourth comparison circuit configured to store the first and second failure addresses when the soft repair control signal is disabled, and configured to generate seventh and eighth pre-detection signals by comparing the stored first and second failure addresses and the first and second internal addresses when the soft repair control signal is enabled; and
- a fourth detection signal output circuit configured to generate the fourth detection signal, which is enabled when both the seventh and eighth pre-detection signals are enabled.

28. The semiconductor device according to claim 26, wherein the fourth transfer signal generation circuit comprises:
- a fourth decoder configured to generate thirteenth, fourteenth, fifteenth, and sixteenth decoding signals by decoding the third and fourth internal addresses in response to the refresh signal;
- a fourth storage circuit configured to store the thirteenth decoding signal and the fifteenth decoding signal in response to the soft repair control signal, and configured to generate a fourth storage signal which is enabled when both the thirteenth decoding signal and the fifteenth decoding signal are enabled in response to the enable signal; and
- a fourth transfer signal output circuit configured to output the fourth storage signal as the fourth transfer signal in response to the thirteenth decoding signal and the fifteenth decoding signal.

* * * * *